United States Patent [19]
Nanya et al.

[11] Patent Number: 5,782,995
[45] Date of Patent: Jul. 21, 1998

[54] SOLAR BATTERY DEVICE AND METHOD OF FABRICATING THE SAME

[75] Inventors: Takanori Nanya; Yasushi Murata, both of Saitama, Japan

[73] Assignee: Citizen Watch Co., Ltd., Tokyo, Japan

[21] Appl. No.: 637,671

[22] PCT Filed: Nov. 4, 1994

[86] PCT No.: PCT/JP94/01861

§ 371 Date: May 2, 1996

§ 102(e) Date: May 2, 1996

[87] PCT Pub. No.: WO95/12897

PCT Pub. Date: May 11, 1995

[30] Foreign Application Priority Data

| Nov. 5, 1993 | [JP] | Japan | 5-059578 U |
| Nov. 30, 1993 | [JP] | Japan | 5-063999 U |
| Jul. 14, 1994 | [JP] | Japan | 6-161846 |
| Jul. 21, 1994 | [JP] | Japan | 6-169106 |
| Sep. 2, 1994 | [JP] | Japan | 6-209004 |
| Sep. 14, 1994 | [JP] | Japan | 6-219828 |

[51] Int. Cl.$^6$ .................... H01L 31/055; H01L 31/18
[52] U.S. Cl. ................. 136/257; 136/256; 257/435; 437/2; 437/225
[58] Field of Search ................. 136/256, 257; 257/435; 437/2-5, 225

[56] References Cited

FOREIGN PATENT DOCUMENTS

| 60-147681 | 8/1985 | Japan . |
| 60-148172 | 8/1985 | Japan ................. 136/257 |
| 60-148174 | 8/1985 | Japan ................. 136/257 |
| 61-241983 | 10/1986 | Japan . |
| 2-119186 | 5/1990 | Japan . |
| 2-177573 | 7/1990 | Japan . |
| 3-57952 | 6/1991 | Japan . |
| 4-76964 | 3/1992 | Japan . |
| 5-29641 | 2/1993 | Japan . |

*Primary Examiner*—Aaron Weisstuch
*Attorney, Agent, or Firm*—Armstrong, Westerman, Hattori, McLeland, & Naughton

[57] ABSTRACT

A screening layer is disposed on the front side of a solar battery to diffuse reflected light from the solar battery so as to reduce the quantity of light traveling outward from the front side of the solar battery. The screening layer prevents the reflected light from traveling outward so that the solar battery disposed on the back side thereof is concealed from view. An optical member is disposed on the front side of the screening layer to transmit light of wavelengths in a predetermined wavelength range included in the light incident the front surface thereof at a predetermined transmittance, and a diffusing layer is disposed on the front side of the optical member to diffuse reflected light from the optical member in nondirectional, soft light rays.

19 Claims, 13 Drawing Sheets

SOLAR BATTERY DEVICE AND METHOD OF FABRICATING THE SAME

FIELD OF THE INVENTION

The present invention relates to a solar battery device that uses light as an energy source and a method of manufacturing the same.

BACKGROUND OF THE INVENTION

Solar cells fabricated by processing single crystal silicon, polycrystalline silicon or amorphous silicon have been used as energy sources for driving various apparatuses including watches, desk calculators and radios.

When installing solar batteries in such apparatuses, the conventional solar batteries must be set exposed to view, so that the color of the solar batteries visible from the outside has had an adverse effect on the design of the apparatuses. The use of solar batteries places restrictions particularly on the design of decorative apparatuses, such as watches, and thus the value of the product is affected greatly by the use of solar batteries. Accordingly, improvements in solar batteries have been eagerly desired.

Techniques proposed to meet such demand for improvement are proposed in JP-A No. (5-29641, in which a color filter or a colored layer that transmits only light of wavelengths in a specific wavelength range are placed in front of a solar battery in order to conceal the solar battery.

However, a color filter placed in front of a solar battery absorbs incident radiant energy thereby reducing the amount of radiation energy that reaches the solar battery. Consequently, it is very difficult to conceal the solar battery from view while supplying sufficient radiant energy necessary for power generation to the solar battery.

When the colored layer proposed in JP-A No. 5-29641 is employed, it is possible to conceal the solar battery from view while supplying sufficient radiant energy to the solar battery. However, the aesthetic appearance of the product employing the colored layer is not necessarily satisfactory, because the colored layer has a cloudy, lightly reflective color in order to give priority to concealing the solar battery and hence the colored layer places restrictions on the design of the product.

The present invention has been made in view of such technical circumstances and it is therefore an object of the present invention to conceal a solar battery from view while supplying sufficient radiant energy to the solar battery, to enable the use of a variety of colors and to enable diversification of the design of products.

SUMMARY OF THE INVENTION

With the foregoing object in view, a first solar battery device in accordance with the present invention comprises a screening layer disposed so as to overlie a solar battery to diffuse light reflected from the solar battery so that the quantity of the light reflected from the solar battery is reduced; an optical member disposed so as to overlie the screening layer to transmit only wavelengths of the light in a predetermined wavelength range at a predetermined transmittance; and a diffusing layer disposed so as to overlie the optical member to diffuse the outgoing light reflected from the optical member.

The optical member may consist of, for example, an interference filter layer.

The desired wavelength range of the transmittance of the interference filter layer can be obtained by using a material having a larger refractive index and a material having a smaller refractive index in combination and determining the number and optical thicknesses of the component layers. Expression of diversified colors of different lightnesses, saturations, and hues can be realized by setting the wavelength range of transmittance in a visible range.

The optical member may be a high refractive index layer formed of a material having a large refractive index.

The high refractive index layer exhibits a reflectance at the interface between the high refractive index layer and a medium due to the difference in refractive index between the layer and the medium. For example, in the interface between the high refractive index layer and air, the greater the refractive index of the high refractive index layer, the greater is the reflectance. Therefore, the high refractive index layer increases the intensity of reflected light, so that the brightness of the reflected light is enhanced. Therefore, when a substantially transparent high refractive index layer that does not absorb radiant radiation in the visible region is used in combination with a white diffusing layer, the white diffusing layer appears white owing to a large amount of reflection at the interface and all the incident radiant energy other than that reflected at the interface is transmitted and falls on the solar battery, so that the electromotive output of the solar battery can be enhanced. Since the radiant energy absorbed by the high refractive index layer is wasted, it is desirable that the high refractive index layer should have a low absorption coefficient. A desirable refractive index of the high refractive index layer is 1.6 or above.

The optical member may be a dielectric multilayer film formed on a transparent substrate and capable of transmitting light of a bright line wavelength in the visible region.

This constitution is particularly effective in optimizing the spectral transmission and reflecting characteristics of the optical member with respect to light emitted by fluorescent lamps generally used as interior illumination sources. The emission spectrum of fluorescent lamps has bright lines at three wavelengths in the visible region. It is possible to supply increased radiant energy that contributes to power generation to the solar cells by transmitting light of at least one of these three bright line wavelengths by the optical member.

The diffusing layer serves to uniformly diffuse the reflected light reflected from the optical member. Since the reflected light reflected from the optical member is directional and hence dazzling, the transmitted and reflected light is visible and the colors of the reflected light and the transmitted light are mixed to reduce the purity of color, so the diffusing layer is used. The diffusing layer enables the soft, nondirectional expression of bright reflected light of a desired color.

The diffusing layer may be formed by dispersing a white powder, i.e., a light scattering substance, in a colorless transparent plastic material or by dispersing transparent particles having a refractive index different from that of the colorless transparent plastic material.

The diffusing layer may be a colorless transparent member having a roughened surface.

Since the diffusing layer is used as means for developing reflected color, it is desirable that the diffusing layer has the largest possible transmittance, provided that the diffusing layer is able to function properly. More concretely, it is preferable that the diffusing layer has a transmittance of 80% or above.

Although most of the light falling on the solar battery is absorbed by the solar battery, part of the light is reflected outward by the periphery of the solar battery to make the solar battery perceptible. The screening layer intercepts the light reflected from the periphery of the solar battery so that the solar battery underlying the screening layer is invisible.

Preferably, the transmittance of the screening layer is in the range of 45 to 85%.

The screening layer may be formed such that it has an anisotropic light transmission characteristic exhibiting different transmittances for different directions of incident light, and the ability thereof to transmit the incident light to the solar battery is higher than that of the same in transmitting the reflected light from the solar battery.

Preferably, the transmittance of the screening layer in transmitting external incident light is in the range of 60 to 96%.

The screening layer can be formed by machining the outer surface of a colorless transparent plate in a three-dimensional shape.

This constitution in accordance with the present invention enables the solar battery to function properly and to be concealed from view, enables diversified bright colors of excellent quality to be seen, increases the degree of freedom of design, and is applicable to a wide variety of apparatuses.

A second solar battery device in accordance with the present invention comprises an optical member disposed so as to overlie a solar battery to transmit wavelengths of light in the visible region included in the incident light at a predetermined transmittance without depending on a specific wavelength; and a diffusing layer disposed so as to overlie the optical member to diffuse reflected light reflected from the optical member. The optical member may be, for example, a high refractive index layer formed of a material having a large refractive index without depending on a specific wavelength.

The diffusing layer may be formed by dispersing a white powder, i.e. a light scattering substance, in a colorless transparent plastic material or by dispersing transparent particles having a refractive index different from that of the colorless transparent plastic material.

The diffusing layer may be a colorless transparent member having a roughened surface.

This constitution in accordance with the present invention enables the solar battery to function properly and to be concealed from view, enables the development of a white appearance of an excellent quality, increases the degree of freedom of design, and is applicable to a wide variety of apparatuses.

This application also discloses methods of fabricating a solar battery device, in a first to a fourth aspect of the present invention. These methods are applied to fabricating a solar battery device comprising a screening layer disposed so as to overlie a solar battery to diffuse light reflected from the solar battery so that the quantity of the light reflected from the solar battery is reduced; an optical member disposed so as to overlie the screening layer to transmit only wavelengths of light in an predetermined wavelength range at a predetermined transmittance; and a diffusing layer disposed so as to overlie the optical member to diffuse light reflected from the optical member. These methods are characterized by the following processes of forming the diffusing layer and the screening layer.

The method of fabricating a solar battery device according to the first aspect of the present invention forms the diffusing layer by the steps of mechanically roughening one surface of a colorless transparent plate in an irregularly rough shape, and chemically etching the surface.

The method of fabricating a solar battery device according to the second aspect of the present invention forms the diffusing layer by the steps of forming a mother die having a surface having irregularities, and casting a transparent resin over the surface of the mother die or on an electroformed mold formed by using the mother die, to form irregularities on a surface of the transparent resin.

The method of fabricating a solar battery device according to the third aspect of the present invention forms the screening layer by the step of mechanically roughening one surface of a colorless transparent plate in an irregularly rough shape.

The method of fabricating a solar battery device according to the fourth aspect of the present invention forms the screening layer by the steps of forming a mother die having a surface having irregularities, and casting a transparent resin over the surface of the mother die or on an electroformed mold formed by using the mother die, to form irregularities on a surface of the transparent resin.

This application further discloses methods of fabricating a solar battery device, in a fifth and a sixth aspect of the present invention. These methods are applied to fabricating a solar battery device comprising an optical member disposed so as to overlie a solar battery to transmit wavelengths of light in the visible region included in incident light at a predetermined transmittance without depending on a specific wavelength; and a diffusing layer disposed so as to overlie the optical member to diffuse light reflected from the optical member. These methods are characterized by the preceding processes of forming the diffusing layer.

The method of fabricating a solar battery device according to the sixth aspect of the present invention forms the diffusing layer by the steps of forming a mother die having a surface having irregularities, and casting a transparent resin over the surface of the mother die or on an electroformed mold formed by using the mother die to form irregularities on a surface of the transparent resin.

DETAILED DESCRIPTION OF THE INVENTION

Preferred embodiments of the present invention will be described hereinafter with reference to the accompanying drawings.

First Embodiment

Figure 1:
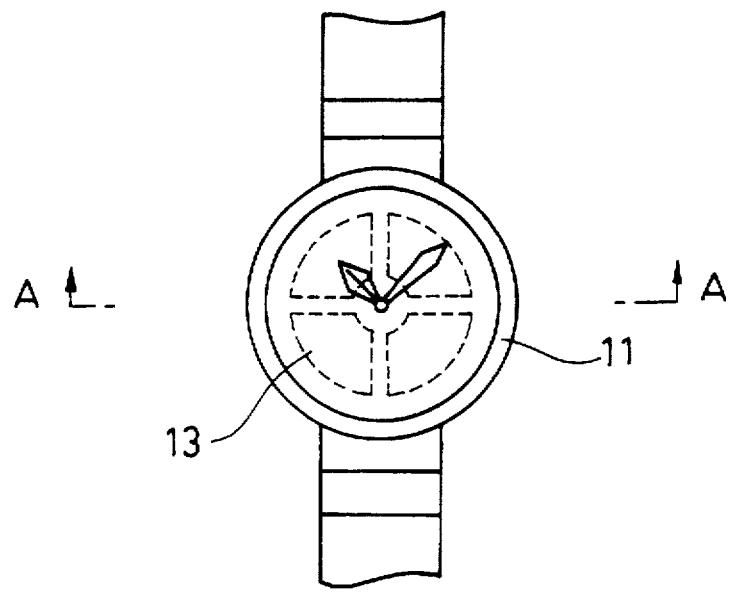
FIG. 1 is a typical front view of a wristwatch incorporating a solar battery device in a first embodiment according to the present invention.
Figure 2:
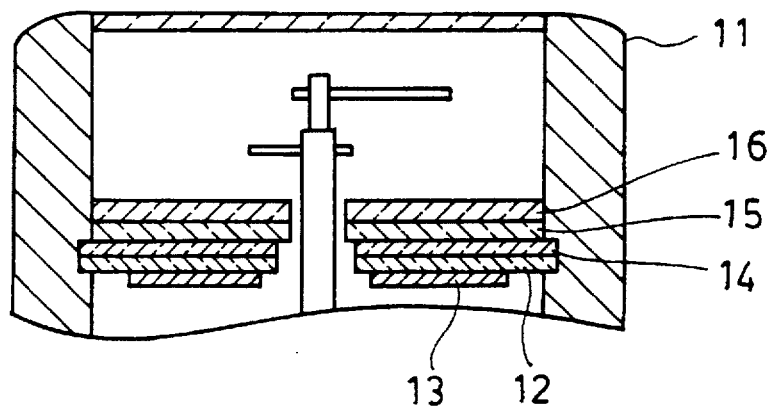
FIG. 2 is a typical sectional view taken on line A—A in FIG. 1 showing the solar battery device and components of the wristwatch disposed on the front side of the solar battery device.

FIG. 1 is a typical front view of a wristwatch incorporating a solar battery device in a first embodiment according to the present invention having a solar battery divided into four parts and disposed on the inside of a dial plate, and FIG. 2 is a typical sectional view taken on line A—A in FIG. 1 showing the solar battery device and components of the wristwatch disposed on the front side of the solar battery device.

A glass substrate 12 is fixedly held by the inner surface of a case 11. A solar battery 13 is formed on the back surface of the glass substrate 12 by processing an amorphous silicon film formed by a plasma CVD process.

The screening layer 14 is formed on the front surface of the glass substrate 2 to diffuse light reflected from the solar battery 13 so that only a reduced quantity of reflected light may travel toward the front. An interference filter layer 15, i.e., an optical member, and a diffusing layer 16 are formed in that order on the front side of the screening layer 14. The diffusing layer 16 functions also as the dial of the solar wristwatch.

The screening layer 14 and the diffusing layer 16 may be formed by mechanically roughening a surface of a transparent sheet, such as a glass sheet or a plastic film, or by modifying the surface of a plastic film. Both the screening layer 14 and the diffusing layer 16 may be a layer of a material that assumes a white appearance due to its molecular structure, such as Teflon or Derlin. Both the screening layer 14 and the diffusing layer 16 may have a structure formed by coating a transparent base with a film of a mixture of a binder and calcium carbonate powder or the like, or with a transparent film containing a light scattering substance. Most simply, both the screening layer 14 and the diffusing layer 16 may be a paper sheet or a piece of fabric.

The screening layer 14 of the first embodiment was formed by processing the front surface of the 300 μm thick glass substrate 12 by a honing process using 120 mesh SiC powder with an average surface roughness Ra in the range of 1.4 to 1.6 μm and an average depth of about 7 μm. The transmittance of the screening layer 14 was 80%.

One major surface of a 300 μm thick glass plate was processed by a honing process using 1000 mesh equivalent SiC powder with an average surface roughness Ra in the range of 0.7 to 0.9 μm and an average depth of 2 μm to form the diffusing layer 16. The transmittance of the diffusing layer 16 was 90%.

The respective transmittances of the screening layer 14 and the diffusing layer 16 were adjusted by using different materials and different honing conditions to examine a possible range of application.

In the first embodiment, the interference filter layer 15 was formed of $TiO_2$, which is a high refractive index material (Hi) having a large refractive index, and $SiO_2$, which is a low refractive index material (L) having a small refractive index. Interference filter layers 15 respectively having, for example, control wavelengths of 550 nm, 435 nm, and 640 nm were formed by stacking films of the high refractive index material and the low refractive index material in a five-layer structure. Reflected light is yellow when the control wavelength is 550 nm, blue when the control wavelength is 435 nm, and red when the control wavelength is 640 nm.

Interference filter layers 15 having the same tint and different transmittances can be formed by controlling reflectance in a wavelength region in which light is reflected by selectively determining the materials, the number of the layers of the layered structure and the thicknesses of the films, so as to control the wavelength range of transmittable light waves.

The screening layer 14, the interference filter layer 15 and the diffusing layer 16 were formed in that order one upon another, and the solar battery 13 was formed on the back surface of the glass substrate 12 having the front surface on which the screening layer 14 was formed, and the quantity of radiant energy that falls on the solar battery 13 from the front side was evaluated for electromotive output, and the effect of screening the solar battery 13 and the quality of the appearance were evaluated. An interference filter layer 15 that reflects bright blue light was employed.

The quantity of radiant energy that falls on the solar battery 13 is dependent on the reflected light color, and the electromotive output of the solar battery 13 varies with the quantity of radiant energy that falls on the solar battery 13. The correlation between the screening effect on the solar battery 13 and the quality of appearance was not dependent on the reflected light color.

The solar battery device was evaluated in comparison with a solar battery device consisting of only a solar battery (conventional solar battery device), a solar battery device having a color absorption filter disposed on the front side of the solar battery (Comparative Example 1), and a solar battery device of the constitution disclosed in JP-A No. 5-29641 employing an interference filter as a color layer (Comparative Example 2).

In evaluating the electromotive output, an electromotive force of 1.3 V or more under an ordinary indoor illuminating condition (minimum illuminance: 100 1x) was used as a lower limit for acceptance. Results of the evaluation are shown in Table 1.

Therefore, conditions to be satisfied by the screening layer 14 and the diffusing layer 16 are dependent on the color of reflected light. However, it was found that the foregoing requirements are satisfied when the total transmittance of the screening layer 14 and the diffusing layer 16 is in the range of about 40 to about 80%, which is equivalent to a transmittance of 80% or above, preferably, 90% or above of the diffusing layer 16 and a transmittance of 45 to 85% of the screening layer 14.

Figure 4:
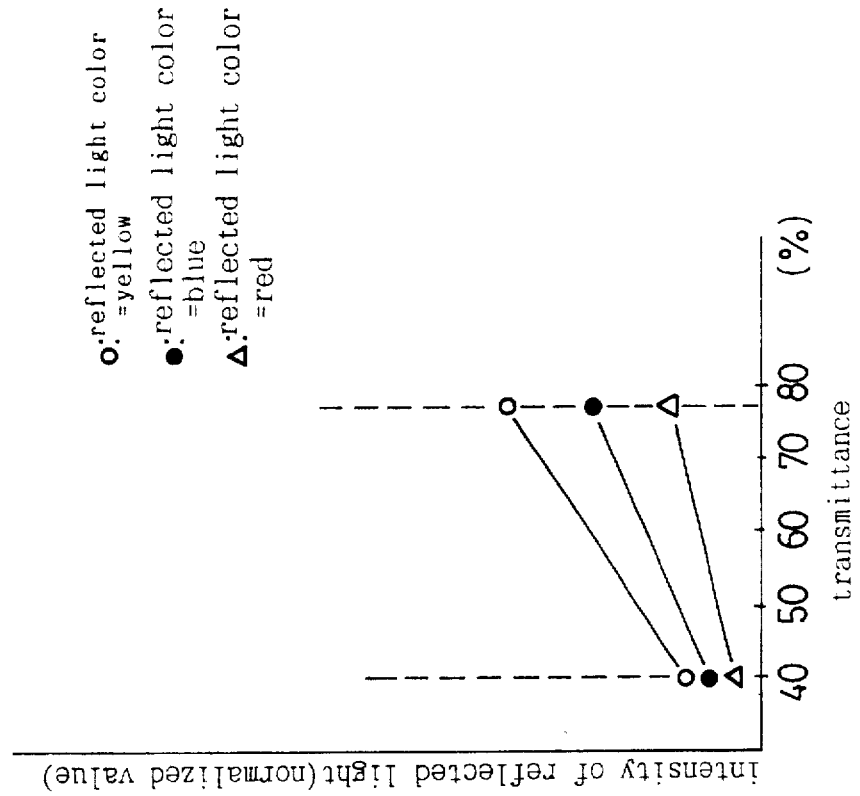
FIG. 4 is a graph showing the relation between the transmittance of a diffusing layer included in a solar battery device in Comparative Example 2 and the intensity of reflected light.
Figure 3:
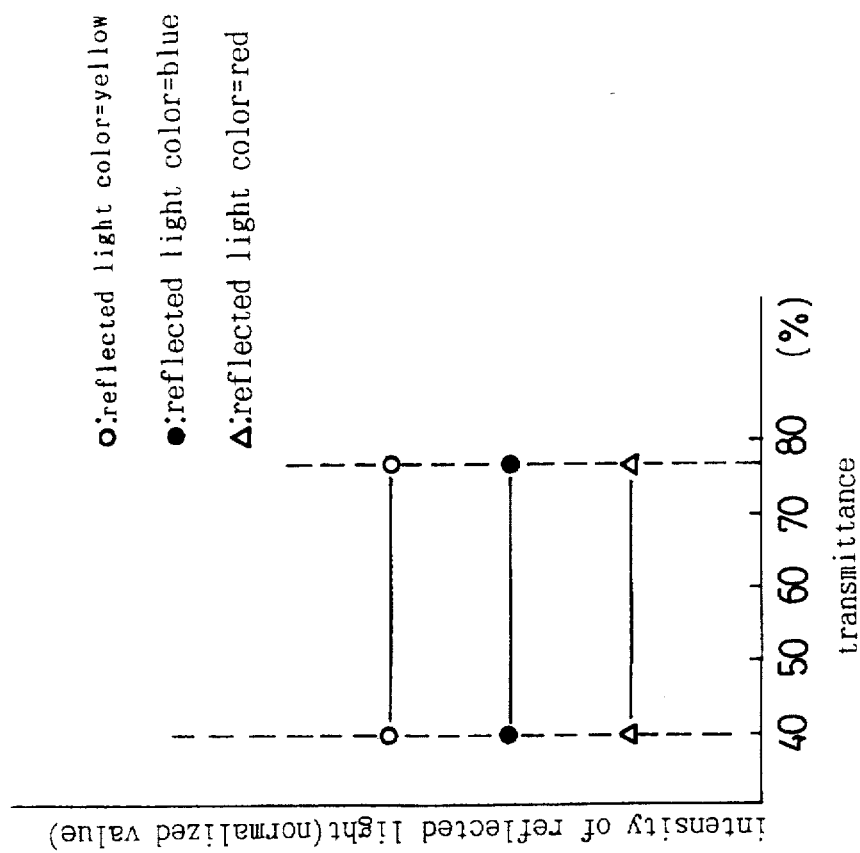
FIG. 3 is a graph showing the relation between the transmittance of a diffusing layer included in the solar battery device in the first embodiment, and the intensity of reflected light.

The first embodiment and Comparative Example 2 were entirely different in the quality of appearance, as shown in FIGS. 3 and 4.

Whereas only the diffusing layer is employed for concealing the solar battery and developing an appearance in the

TABLE 1

| | Screening layer Transmittance | Filter layer | Diffusing layer Transmittance | Electromotive force V | Concealing effect | Appearance |
|---|---|---|---|---|---|---|
| Prior Art | — | — | — | 1.6 | × | — |
| Comp. Ex. 1 | — | Absorbed color: Blue | — | 1.4 | × | × |
| Comp. Ex. 2 | — | Color reflected by interference: Blue | 72% | 1.5 | ○ | × |
| First embodiment | 80% | Color reflected by interference: Blue | 90% | 1.5 | ○ | ○ |

Concealing effect:
× = the solar battery is not concealed
○ = the solar battery is concealed
Appearance:
× = the appearance has a poor quality
○ = the appearance has an excellent quality As is obvious from Table 1, whereas the conventional solar battery device and Comparative Examples 1 and 2 are unable to satisfy all the requirements for enhancing the electromotive force of the solar battery, for concealing the solar battery, and for the quality of appearance, in the first embodiment of the present invention, the solar battery is concealed satisfactorily while providing an electromotive force in an effective range of electromotive force, and the appearance has an excellent quality, all of which enables an excellent design without paying any attention to the appearance of the solar battery at all.

The effect of the structural difference between the first embodiment and Comparative Example 2 on the quality of appearance was examined. The quantity of light energy transmitted through the component layers of the first embodiment was measured by an illumination photometer to examine conditions to be met by the screening layer 14 and the diffusing layer 16.

Results of examination showed that the quantity of light energy supplied to the solar battery of the first embodiment was substantially equal to that of the light energy supplied to the solar battery of Comparative Example 2 when the product of the respective transmittances of the screening layer 14 and the diffusing layer 16 was nearly equal to the transmittance of the diffusing layer of Comparative Example 2, provided that the first embodiment and Comparative Example 2 had with interference filter layers of the same performance, respectively.

The change in color of the light reflected from the interference filter layer causes the change in quantity of energy transmitted through the interference filter layer in the range of 40 to 80% of the total incident energy, and the electromotive force of the solar battery and the screening effect change accordingly.

structure of Comparative Example 2, the screening layer 14 is employed principally in concealing the solar battery 13 and the diffusing layer 16 is employed principally in developing an appearance by the reflected light in the first embodiment.

The intensity of reflected light shown in FIGS. 3 and 4 indicates the intensity of reflected light from the interference filter layer 15. The transmittance shows the percentage of the incident light which reaches the solar battery 13.

FIG. 3 shows the measurement result of the first embodiment having a structure of the diffusing layer 16 which is layered on the interference filter layer 15 which is layered on the screening layer 14 which is layered on the solar battery 13. FIG. 4 shows the measurement result of the Comparative Example 2 having a structure of a diffusing layer which is layered on the interference filter layer which is layered on the solar battery (no screening layer is employed).

It is necessary to lower the transmittance to conceal the solar battery 13. In the first embodiment only the transmittance of the screening layer 14 is varied, whereas the transmittance of the diffusing layer 16 is fixed. FIG. 3 shows the intensity of reflected light from the interference filter layer 15 when the transmittance (to the solar battery) is varied.

Therefore, it is possible for the structure of the first embodiment to keep the intensity of reflected light from the interference filter layer 15 constant even if the transmittance is lowered to conceal the solar battery 13.

On the other hand, there is only one way for the Comparative Example 2 to lower the transmittance, that is, to lower the transmittance of the diffusing layer 16. When the transmittance of the diffusing layer 16 is lowered, amount of the incident light to the interference filter layer 15 is reduced, and the intensity of reflected light from the interference filter layer 15 is changed as shown in FIG. 4. Consequently, the reflected light becomes dim and cloudy, causing significant deterioration of the quality of the appearance.

Although the interference filter layer 15 of the first embodiment is a five-layer structure of $TiO_2$ films and $SiO_2$ films, various types of interference filter layers suitable for use as the interference filter layer 15 can be formed by using other materials and by simple change of design.

The interference filter 15 is a suitable component of the present invention for satisfying the requirements for supplying energy to the solar battery and developing the color of the reflected light because the interference filter layer 15 does not absorb the incident light, and transmits or reflects the incident light.

The interference filter layer 15 is able to transmit light which would normally be reflected and increases the degree of freedom of design dependent on the color of reflected light. Although the first embodiment uses a glass plate finished by honing as the diffusing layer 16, the diffusing layer 16 may be formed of a plastic material or the like.

The screening layer 14 and the diffusing layer 16 may be formed directly on the interference filter layer 15 or the solar battery 13 by a thin film forming process, such as a spin coating process, a dipping process, or an evaporation process.

It was confirmed that diffusing layers formed by processing the surface of a transparent substrate in the shape of a fisheye lens, a lenticular lens, or a Fresnel lens, produce effects similar to that of the diffusing layer 16 formed by a honing process.

Second Embodiment

Figure 5:
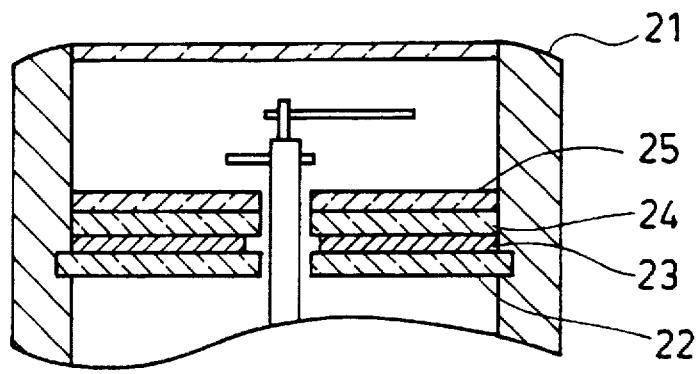
FIG. 5 is a typical sectional view showing a solar battery device in a second embodiment according to the present invention incorporated into a wristwatch, and components of the wristwatch disposed on the front side of the solar battery device.

FIG. 5 is a typical sectional view showing a solar battery device in a second embodiment according to the present invention incorporated into a wristwatch, and components of the wristwatch disposed on the front side of the solar battery device.

A substrate 22 is fixedly held by the inner surface of a case 21. The substrate 22 may be a metal substrate or an insulating substrate. The substrate 22 employed in the second embodiment is a 300 μm thick glass substrate. A solar battery 23 is formed on the front surface of the glass substrate 22 by processing an amorphous silicon film formed by a plasma CVD process.

A high refractive index layer 24, i.e., an optical member, and a white diffusing layer 25, are formed in that order on the front side of the solar battery 23 so as to cover the solar battery 23. The diffusing layer 25 also functions as a dial of the solar wristwatch.

More concretely, a 125 μm (equivalent to λ/4) thick tantalum pentoxide film having a refractive index of 2.1 was deposited on one major surface of a 300 μm thick glass substrate as the high refractive index layer 24. The other major surface of the same glass substrate was processed by a honing process using 100 mesh SiC powder to form the white diffusing layer 25.

The transmittance of the high refractive index layer 24 formed on the glass substrate in the visible region was not dependent on wavelength and was about 80% (reflectance: 20%). The transmittance of the white diffusing layer 25 was substantially uniformly 75% for all wavelengths in the visible region.

The transmittance of the high refractive index layer 24 can be adjusted by adjusting the refractive index of the high refractive index layer 24 because the reflectance of the high refractive index layer 24 varies with the refractive index. The transmittance of the white diffusing layer 25 also can be adjusted by selectively determining the honing material and processing conditions.

As mentioned above, the white diffusing layer 25 may be formed by a layer of a material that assumes a white appearance due to its structure, such as Teflon, Derlin, paper or fabric. The white diffusing layer 25 may be a structure formed by coating a transparent base with a film of a mixture of a binder and calcium carbonate powder or the like, or a transparent film containing a scattering substance. The white diffusing layer 25 may be formed by processing the surface of a transparent substrate in the shape of a fisheye lens, a lenticular lens, or a Fresnel lens.

The white diffusing layer 25 may be formed directly on the solar battery 23 or the high refractive layer 24 by a thin film forming process, such as a spin coating process, a dipping process, or an evaporation process. When bonding the superposed components with an adhesive, the adhesive may contain a material having the function of the white diffusing layer.

The solar battery device was fabricated by laminating the thus formed high refractive index layer 24 and the white diffusing layer 25 on the front side of the solar battery 23. The quantity of radiant energy that falls on the solar battery 23 was evaluated by electromotive output, and the effect in screening the solar battery 23 and the quality of the appearance were evaluated.

The solar battery device was evaluated in comparison with a solar battery device consisting of only a solar battery (conventional solar battery device), and two solar battery devices respectively having solar batteries and absorbing white filters disposed on the front sides of the corresponding solar batteries and having different transmittances (Comparative Examples 3 and 4).

When evaluating the electromotive output, an electromotive force of 1.3V under an ordinary indoor illuminating condition (illumination by a fluorescent lamp) was used as a lower limit for acceptance. Results of the evaluation are shown in Table 2.

As is obvious from Table 2, whereas the conventional solar battery device and Comparative Examples 3 and 4 are unable to satisfy all the requirements for enhancing the electromotive force of the solar battery, for concealing the solar battery and the quality of appearance, in the second embodiment of the present invention, the solar battery is concealed satisfactorily while obtaining an electromotive force in an effective range of electromotive force, and the appearance has an excellent quality.

TABLE 2

| | Means for exhibiting white appearance | Electromotive force (V) | | Concealing effect | Appearance |
|---|---|---|---|---|---|
| Prior Art | — | 1.6 | ○ | × | — |
| Comp. Ex. 3 | Absorbing filter | 1.2 | × | ○ | ○ |

TABLE 2-continued

| | Means for exhibiting white appearance | Electromotive force (V) | Concealing effect | Appearance |
|---|---|---|---|---|
| Comp. Ex. 4 | (transmittance: 40%) Absorbing filter (transmittance: 60%) | 1.5 | ○ | × | × |
| Second embodiment | High refractive layer/White diffusing layer (transmittance: 60%) | 1.5 | ○ | ○ | ○ |

Concealing effect:
× = the solar battery is not concealed
○ = the solar battery is concealed
Appearance:
× = the appearance has a poor quality
○ = the appearance has an excellent quality Although the second embodiment employed a tantalum pentoxide thin film having a refractive index of 2.1 as the high refractive index layer 24, a thin film of a material having a refractive index of 1.6 or above that does not absorb light of wavelength in the visible region, such as an aluminum oxide thin film or a titanium oxide film, may be used as the high refractive index layer 24. The high refractive index layer 24 need not be limited to a thin film formed on a glass substrate but may be a film of a plastic material.

Third Embodiment

Figure 6:
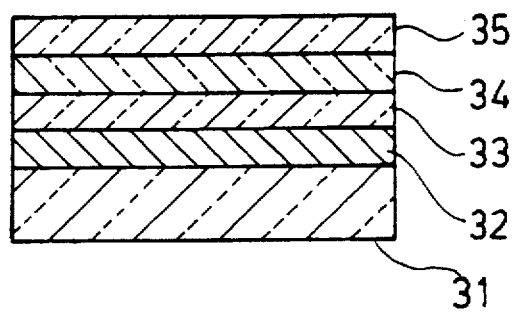
FIG. 6 is a typical sectional view of a solar battery device in a third embodiment according to the present invention.

FIG. 6 is a typical sectional view of a solar battery device in a third embodiment according to the present invention.

Similarly to the second embodiment, a solar battery 32 was formed on a substrate 31, a first white diffusing layer 33 as a screening layer, a high refractive index layer 34 as an optical member, and a second white layer 35 as a diffusing layer were formed in that order on the solar battery 32 to build a solar battery device.

More concretely, the first white diffusing layer 33 having a transmittance of 83% was formed by processing a major surface of a glass sheet by a honing process, and the high refractive index layer 34 having a transmittance of 80% was formed by depositing a tantalum pentoxide thin film having a refractive index of 2.1 on the other major surface of the glass sheet.

The second white diffusing layer 35 formed by roughening a surface or a 0.1 mm thick plastic film was laminated to the high refractive index layer 34.

The first white diffusing layer 33, the high refractive index layer 34 and the second white diffusing layer 35 thus formed were superposed on the front side of the solar battery 32. The third embodiment was evaluated by the same method as the second embodiment was evaluated. The electromotive output of the solar battery 32 and the effect of the layers in concealing the solar battery 32 were substantially the same as those of the second embodiment. The appearance of the third embodiment was brighter than that of the second embodiment.

Such results are inferred to be due to the large transmittance of the second white diffusing layer 35 that contributes to enhancing the intensity if reflected light reflected outward from the high refractive index layer 34.

On the other hand, it is considered that the solar battery concealing effect of the third embodiment is on the same level as that of the solar battery concealing effect of the second embodiment because the effect of concealing the solar battery 32 is dependent on the respective transmittances of the first white diffusing layer 33 and the second white diffusing layer 35.

It was found that all the characteristics are satisfactory when allowable transmittance ranges for the first white diffusing layer 33 and the second diffusing layer 35, as considered on the basis of the quantity of radiant energy that reaches the solar battery 32 and the quality of appearance, are about 40 to about 80%.

These allowable transmittance ranges are equivalent to the transmittance range of about 45 to 85% for the first white diffusing layer 33 and 80% or above for the second white diffusing layer 35.

It is desirable that the second white diffusing layer 35 has the largest possible transmittance, provided that the second white diffusing layer 35 does not deteriorate the quality of appearance.

Fourth Embodiment

In fourth to eighth embodiments, conditions to be met by a diffusing layer for scattering reflected light from an optical member, such as an interference filter layer or a high refractive index layer, were examined for optimization.

The diffusing layer must have both a scattering ability and a large transmittance to obtain a solar battery device having an appearance of excellent quality. Incident light travels through the white diffusing layer, part of the incident light is reflected by the optical member, and the rest is transmitted. The reflected light is scattered by the diffusing layer and the scattered light is perceived as a uniform color.

The transmitted light falls on the solar battery to contribute to power generation. If the diffusing layer has a comparatively small transmittance, the intensities of both the reflected light and the transmitted light are reduced and, consequently, the appearance cannot be developed as a clear color and the power generating characteristic is lowered. Therefore, it is desirable that the transmittance of the diffusing layer is 80% or above, more preferably, 90% or above.

It was found through the examination of conditions for obtaining a diffusing layer having such characteristics that a white diffusing layer has a large transmittance of 80% or above when the same is formed of a colorless transparent plastic material containing white powder, i.e., a light scattering substance, or transparent particles dispersed therein of a refractive index different from that of the plastic material.

A scattering ability compatible with conditions for a large transmittance were estimated. A diffusion coefficient was defined by the following expression:

Diffusion coefficient={Total transmittance−Rectilinear transmittance}/Total transmittance where: the total transmittance is the ratio of an amount of light transmitted by the diffusing layer compared to an amount of light originally incident thereupon; and, the rectilinear transmittance is the ratio of an amount of light detected by a light detecting optical fiber disposed on one side of the diffusing layer compared to the amount of light originally emitted from an identical optical fiber disposed on the other side of the diffusing layer, and spaced a predetermined distance therefrom.

Also, the correlation between the scattering ability and the scattering coefficient were examined.

It was found that a diffusing layer having a diffusion coefficient ≧0.3 has a diffusing ability satisfying the requirements for the quality of appearance. The results of examination also proved that a white diffusing layer having a large transmittance of 80% or above and a diffusion coefficient of 0.3 or above can be obtained.

The embodiment will be concretely described hereinafter with reference to the accompanying drawings.

Figure 7:
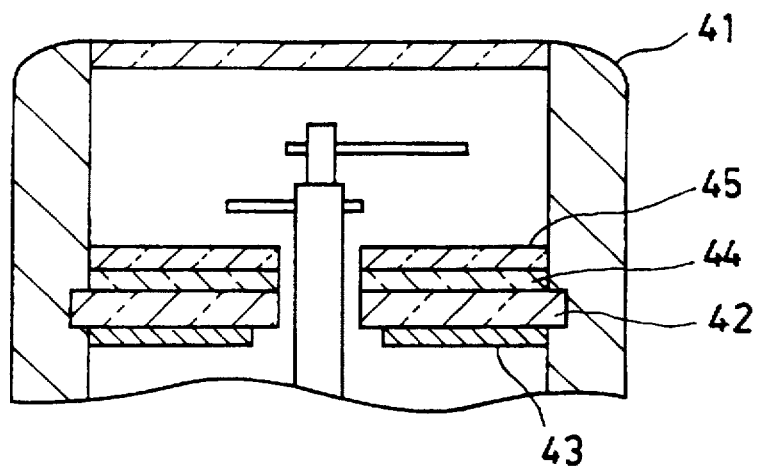
FIG. 7 is a typical sectional view showing a solar battery device in a fourth embodiment according to the present invention incorporated into a wristwatch, and components of the wristwatch disposed on the front side of the solar battery device.

FIG. 7 is a typical sectional view showing a solar battery device in the fourth embodiment according to the present invention incorporated into a wristwatch, and components of the wristwatch disposed on the front side of the solar battery device.

A glass substrate 42 is fixedly held by the inner surface of a case 41. A solar battery 43 is formed on the back surface of the glass substrate 42 by processing an amorphous silicon film formed by a plasma CVD process.

An optical member 44 and a white diffusing layer 45, are formed in that order on the front surface of the glass substrate 42. The white diffusing layer 45 functions also as the dial of the solar wristwatch.

The optical member 44 is a high refractive index layer. More concretely, the high refractive index layer is an about 60 nm thick titanium oxide thin film having a refractive index of 2.3 and a reflectance of about 25%, and is deposited on the glass substrate 42 by an evaporation process.

Figure 8:
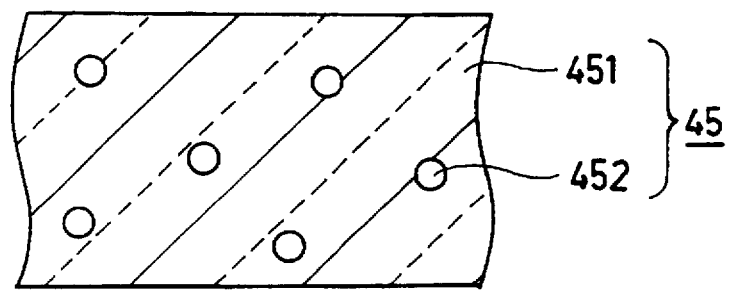
FIG. 8 is a typical sectional view of a white diffusing layer employed in the fourth embodiment.

FIG. 8 is a typical sectional view of the white diffusing layer 45. The white diffusing layer 45 was formed by spreading a mixture of a colorless transparent plastic material 451, such as a PMMA (methyl methacrylate) resin, containing 10% by wt. light scattering particles 452, such as PS (polystyrene) resin particles of particle size on the order of 20 μm, in a 0.25 mm thick film.

Since both the PMMA resin and the PS particles are transparent, the white diffusing layer 45 has a large transmittance. Since the refractive indexes of 1.49 of the PMMA resin and 1.59 of the PS resin are different from each other, light is scattered by the effect of the difference in refractive index between the PMMA resin and the PS particles. Consequently, the white diffusing layer 45 had a transmittance of about 91% and a diffusion coefficient of about 0.6, and the diffusing performance of the white diffusing layer 45 was satisfactory.

The solar battery device thus fabricated has an ability to produce an excellent quality of appearance in addition to effects of supplying light to the solar battery 43 and concealing the solar battery 43.

In the fourth embodiment, a principal object of the white diffusing layer 45 is to scatter the reflected light from the optical member 44 efficiently so that the appearance has a uniform color. The foregoing constitution assumed a gray appearance having no wavelength dependence in the visual region and was not incompatible with the appearance of the dial of the wristwatch.

The solar battery 43 can be further effectively concealed by additionally interposing a diffusing member between the optical member 44 and the solar battery 43.

Materials other than the PMMA resin as the plastic material 451 and the PS resin particles as the light scattering particles 452 may be used in combination for forming the white diffusing layer 45 of the fourth embodiment.

For example, light scattering particles of a polysulfone resin having a refractive index of 1.63 or a PET (polyethylene terephthalate) resin having a refractive index of 1.58 may be dispersed in the PMMA resin.

A diffusing layer having the same effect as that of the white diffusing layer 45 of the fourth embodiment can be formed by spreading a mixture of a substance having a larger refractive index and a substance having a smaller refractive index dispersed in the former. For example, a diffusing layer formed by spreading a mixture of an epoxy resin having a refractive index in the range of 1.55 to 1.61 and a PVAC (polyvinyl alcohol) having a refractive index of 1.46 dispersed in the epoxy resin may be used.

The transmittance and the dispersion coefficient are greatly dependent on the concentration and the particle size of the light scattering substance dispersed in the plastic material. In the fourth embodiment, the concentration and the particle size of the PS resin dispersed in the PMMA resin were examined. It was found that the white diffusing layer 45 having a satisfactory transmittance of 80% or above and a satisfactory diffusion coefficient of 0.3 or above can be formed when the concentration of the light dispersing substance is in the range of 5 to 40% by wt. and the particle size of the same is in the range of 5 to 50 μm. The color of the appearance can be varied in a wide color range from highly scattering whitish gray to highly clear gray by properly determining the transmittance and the diffusion coefficient.

When an interference filter layer is employed as the optical member 44 shown in FIG. 7 instead of the high refractive index layer, a difference in the ability of the white diffusing layer 45 causes a further conspicuous difference in the quality of appearance.

Since reflected light not having wavelength dependence in the visible region is scattered outward by the white diffusing layer 45 when the high refractive index layer is employed, there is no significant difference even if an opaque component is superposed due to somewhat inferior transmission characteristic of the white diffusing layer 45. On the other hand, the appearance assumes an opaque, cloudy color when the interference filter layer reflects a specific color component if the white diffusing layer 45 has an opaque component.

When developing the appearance as a color, it is desirable, as an ideal condition, that the white diffusing layer 45 has both a light scattering ability and a transmittance nearly equal to 100%. Practically, it is impossible to transmit 100% of incident light because of interfacial reflection and the like. Therefore, it is desirable that the white diffusing layer 45 has the largest possible transmittance.

Fifth Embodiment

FIG. 8 shows a solar battery device example according to a fifth embodiment of the present invention. The solar battery device was fabricated by the same method as the solar battery device in the first embodiment was fabricated, except that the solar battery device in the fifth embodiment has a white diffusing layer 45 containing a white substance as a light scattering substance 452.

The white diffusing layer 45 was formed by spreading a mixture of a PMMA resin, and 0.5% by wt. calcium carbonate powder of a particle size on the order of 10 μm in a 0.25 mm thick film.

Although both major surfaces of a plastic film 451 forming the white diffusing layer 45 are specular, the plastic film 451 has a generally white appearance because the calcium carbonate particles dispersed therein scatter light. The white diffusing layer 45 had a transmittance of about 85% and a diffusion coefficient of about 0.5.

The characteristics of the white diffusing layer 45 can be changed by adjusting the concentration, the particle size, and the state of dispersion of the white particles to form the white diffusing layer 45 according to desired purposes.

Although the solar battery devices in the fourth and the fifth embodiment have been described as applied to solar wristwatches, the solar battery devices are applicable to various apparatuses including radios employing a solar battery as a power supply because the quality of the appearance can be optionally determined by adjusting the transmittance and the diffusion coefficient of the white diffusing layer 45.

Sixth Embodiment

Figure 9:
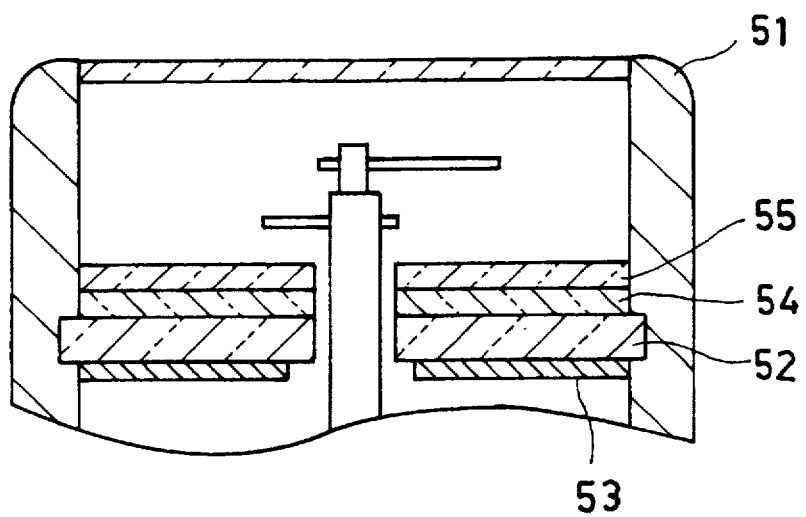
FIG. 9 is a typical sectional view showing a solar battery device in a sixth embodiment according to the present invention incorporated into a wristwatch, and components of the wristwatch disposed on the front side of the solar battery device.

FIG. 9 is a typical sectional view showing a solar battery device in a sixth embodiment according to the present invention incorporated into a wristwatch, and components of the wristwatch disposed on the front side of the solar battery device.

A transparent substrate 52, such as a glass substrate, is fixedly held by the inner surface of a case 51. A solar battery 53 is formed on the back surface of the substrate 52 by processing an amorphous silicon film formed by a plasma CVD process.

An optical member 54 and a white diffusing layer 55 as a diffusing layer are formed in that order on the front surface of the substrate 52. The front surface of the white diffusing layer 55 serves as the dial of the solar wristwatch.

The sixth embodiment employs a high refractive index layer as the optical member 54. More concretely, the high refractive index layer is about a 60 nm thick titanium oxide thin film having a refractive index of 2.3 and a reflectance of about 25% and deposited on the substrate 52 by an evaporation process.

Figure 10:
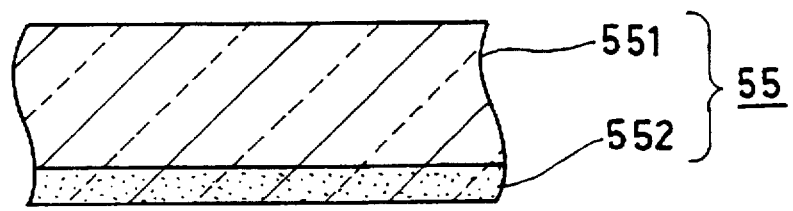
FIG. 10 is a typical sectional view of a white diffusing layer employed in the sixth embodiment.

FIG. 10 is a typical sectional view of the white diffusing layer 55. The white diffusing layer 55 is formed by mechanically roughening one major surface of a glass substrate 551 with an average surface roughness Ra of about 0.02 μm and an average depth of about 0.1 μm by a honing process using 2000 mesh SiC powder. The glass substrate having the surface thus roughened had a transmittance of 91% and a diffusion coefficient of 0.1. This scattering ability is excessively low and the glass substrate 551 is undesirable.

The thus honed surface of the glass substrate 551 was then etched with hydrofluoric acid for ten seconds to form an irregular layer 552 having a transmittance of about 91.5 and an improved diffusion coefficient of about 0.4. These values are large enough for the white diffusing layer 55 to function properly.

It was proved that the solar battery device thus fabricated had an ability to provide an excellent quality of appearance in addition to supplying energy to the solar battery 53 and concealing the solar battery 53.

A principal object of the white diffusing layer 55, similarly to that of the fourth embodiment, is to scatter the reflected light from the optical member 54 efficiently so that the appearance has a uniform color. The foregoing constitution assumed a gray appearance having no wavelength dependence in the visual region and was not incompatible with the appearance of the dial of the wristwatch.

The solar battery 53 can be further effectively concealed by additionally interposing a diffusing member between the optical member 54 and the solar battery 53.

The transmittance and the diffusion coefficient of the white diffusing layer 55 can be changed by changing honing conditions. For example, it was found through experiments using 120 mesh to 4000 mesh SiC powder for honing that both the transmittance and the diffusion coefficient of the white diffusing layer 55 are satisfactory when the honing process used 400 mesh to 2000 mesh SiC powder and the honed surface is processed by an etching process. The color of the appearance can be varied in a wide color range from highly scattering whitish gray to highly clear gray by properly setting the conditions for the honing process.

As mentioned above, the transmittance can be improved but the diffusion coefficient decreases when SiC powder of a higher mesh is used in the honing process and, consequently, the scattering ability is reduced. Therefore, a white diffusing layer satisfying requirements for both transmittance and diffusion coefficient is difficult to be formed only by the honing process. The use of the etching process following the honing process further improves the transmittance and the diffusion coefficient, whereby conditions for the honing process could be satisfied in a wide range.

Although there are many unknown matters concerning the effect of the etching process, it is inferred that the effect of the etching process in rounding the sharp edges of the irregularities formed by the honing process brought about the foregoing improvement.

The morphology of the irregularities is dependent on the conditions of the honing process. Incidentally, a surface processed by an etching process after the same had been honed by a honing process using 800 mesh SiC powder had an aggregate of round irregularities of around 50 μm. A surface processed by an etching process after the same had been honed by a honing process using 2000 mesh SiC powder had an aggregate of round irregularities of several micrometers to about 10 μm.

Although the honing process is used for mechanically roughening the surface of the transparent substrate, such as a glass substrate, in fabricating the solar battery device in the sixth embodiment, the surface of the transparent substrate may be roughened by any suitable machining process other than the honing process.

When an interference filter layer is employed, as the optical member shown in FIG. 9, instead of the high refractive index layer, a difference in the characteristics of the white diffusing layer 55 causes a further conspicuous difference the quality of appearance.

Since reflected light not having wavelength dependence in the visible region is scattered outward by the white diffusing layer 55 when the high refractive index layer is employed, there is no significant difference even if an opaque component is superposed due to somewhat inferior transmission characteristics of the white diffusing layer 55. On the other hand, the appearance assumes an opaque, cloudy color when the interference filter layer reflects a specific color component if the white diffusing layer 55 has an opaque component.

When developing the colored appearance by the interference filter layer, it is desirable that the interference filter layer has a light scattering ability and the largest possible transmittance.

Seventh Embodiment

A solar battery device in a seventh embodiment according to the present invention was fabricated by a method similar to that by which the solar battery device in the sixth embodiment was fabricated. One surface of a glass substrate was mechanically roughened by a honing process using 1000 mesh SiC powder and then the roughened surface was etched with hydrofluoric acid for ten seconds to form irregularities of an average surface roughness Ra of about 0.2 μm and an average depth of about 0.9 μm to obtain a white diffusing glass substrate having a transmittance of about 91% and a diffusion coefficient of about 0.4.

A plastic plate was subjected to a cast transfer process using the glass substrate as a mother die. More concretely, an ultraviolet-setting PMMA (methyl methacrylate) resin film was cast molded on a 0.2 mm thick PC (polycarbonate) plate, and the surface of the mother die was transferred to the ultraviolet-setting PMMA resin film to obtain a plastic substrate having a surface provided with mechanically formed irregularities of an average surface roughness of about 0.3 µm and an average depth of about 1.0 µm. The plastic substrate had a transmittance of about 90.5% and a diffusion coefficient of about 0.5. This plastic substrate is satisfactorily usable as a white diffusing layer 55.

The mother die may be formed by processing the surface of a metal mold by a honing process using SiC powder and etching the honed surface of the metal die.

Productivity in fabricating the solar battery device in the seventh embodiment employing the plastic substrate as the white diffusing layer 55 is higher than that in fabricating the solar battery device employing the glass substrate as the white diffusing layer 55. Particularly, when the solar battery device is to be incorporated into an analog wristwatch, an opening must be formed in the central portion of the white diffusing layer 55 serving also as a dial because the minute hand and the hour hand are supported at a position corresponding to the center of the dial. Although the opening is difficult to form in the glass substrate, the same is easy to form in the plastic substrate, and the opening can be easily formed in a desired shape in the plastic substrate.

Eighth Embodiment

A solar battery device in an eighth embodiment according to the present invention is similar in basic construction to those in the sixth and the seventh embodiments. When fabricating the solar battery device in the eighth embodiment, a mother die for forming a white diffusing layer 55 was made by the following processes.

A gold film formed on a Si wafer of (100) crystal orientation was processed by a photolithographic process and an etching process to remove 5 µm diameter round portions of the gold film at a pitch of 50 µm.

Then, the Si wafer was immersed in a mixture of concentrated hydrofluoric acid, nitric acid, and acetic acid to remove portions of the Si wafer exposed by removing the round portions of the gold film by isotropic etching, and the gold film was removed. Thus a mother die having semispherical recesses regularly arranged on its surface was formed.

The diameters of the recesses are dependent on etching time. When etched for about one hour, the diameters of the regularly arranged semispherical recesses were about 40 µm.

An electroformed mold was formed by using the mother die, and a 0.3 mm thick PC plate having an array of semispherical concave lenses in one major surface thereof was made by an injection molding process, in which a central gate type 0.3 mm thick cavity mold heated at 120° C. was used.

The PC plate had a transmittance of about 88% and a diffusion coefficient of about 0.4 and was satisfactorily usable as a white diffusing layer 55. The characteristics of a PC plate having an array of convex lenses were the same as those of the PC plate having the array of concave lenses.

This method employing the photolithographic process when forming the mother die is able to form the array of lenses accurately and to form round protrusions or round recesses in an optional diameter. The form of the array can be changed by etching the Si wafer by an anisotropic etching.

Although only representative materials were mentioned in the description of the sixth, seventh, and eighth embodiments, a white diffusing layer having a transmittance of 80% or above and a diffusion coefficient of 0.3 or above can be formed of materials other than those mentioned above.

White diffusing layers having the same light transmitting characteristics have the same effect on the power generating ability of the solar battery. Since white diffusing layers having different diffusion coefficients allow for different design possibilities, the solar battery device of the present invention is applicable to a variety of apparatuses including desk calculators and radios using solar batteries.

Since the diffusing layers of the fourth to the eighth embodiments are satisfactory in both transmittance and light scattering effect, a solar battery device having an appearance of an excellent quality and satisfying requirements for supplying energy to the solar cells of the solar battery and concealing the solar cells of the solar battery can be easily fabricated. The solar battery device is applicable to various purposes requiring colored appearances different from the conventional colored appearance.

Ninth Embodiment

In the ninth and tenth embodiments, conditions to be satisfied by a diffusing layer for a solar battery device satisfying requirements for both a high quality of appearance and a high power generating ability so as to obtain an optimum diffusing layer are described.

Conditions to be satisfied by a diffusing layer in fabricating a solar battery device having an excellent quality appearance are to transmit as much light as possible through an optical member to a solar battery and to intercept as much reflected light from the solar battery as possible.

Part of the incident light transmitted by a diffusing layer is reflected by an optical member and the rest of the incident light travels through the optical member. The reflected light is scattered outward by the diffusing layer to give a sense of uniform color.

The transmitted light travels through a diffusing layer and falls on solar battery to give energy for power generation to the solar battery. Since the transmittance of a conventional diffusing layer is nondirectional, the conventional diffusing layer cannot satisfy requirements for both efficiently supplying radiant energy to the solar battery and concealing the solar battery. The ninth and the tenth embodiments further achieve improvements by employing a diffusing layer having an anisotropic light transmitting characteristic.

It was found through studies made to obtain a diffusing layer having such a characteristic, that a diffusing layer formed by processing the surface of a plate member colorless and transparent at least in the visible region, such as a glass plate or a plastic plate, contiguous with an optical member in a three-dimensional shape, transmits incident light through the optical member at a transmittance of 90% or above and transmits incident light from a solar battery at a transmittance of 60% or below.

When this diffusing layer is used, 90% or above of external incident light on the diffusing layer is able to fall on the solar battery for power generation and 54% or below of reflected light from the solar battery is able to travel through the diffusing layer toward the optical member, which is about ⅔ the quantity of reflected light that travels through the conventional diffusing layer toward the optical member.

This fact signifies the enhancement of the solar battery concealing effect while securing the same power generating performance of the solar battery as that of the same solar battery screened by the conventional diffusing layer. A diffusing layer having a surface formed in a morphology that scatters reflected light from the solar battery in all directions exhibits a further enhanced solar battery concealing effect.

A solar battery device of the ninth embodiment will be concretely described with reference to the drawings.

Figure 11:
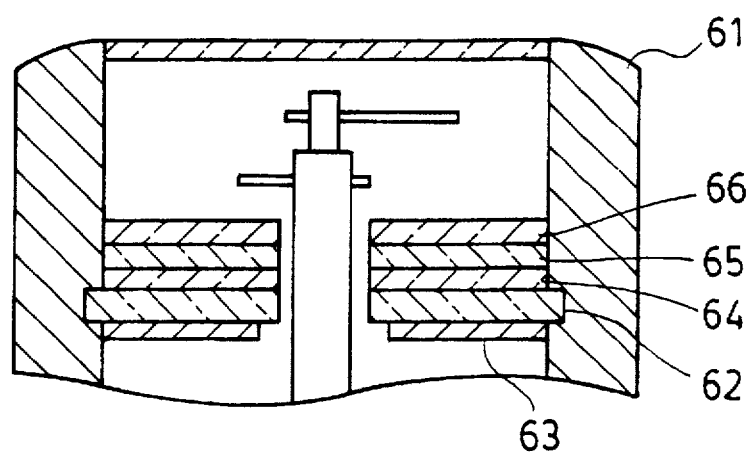
FIG. 11 is a typical sectional view showing a solar battery device in a ninth embodiment according to the present invention incorporated into a wristwatch, and components of the wristwatch disposed on the front side of the solar battery device.
Figure 12:
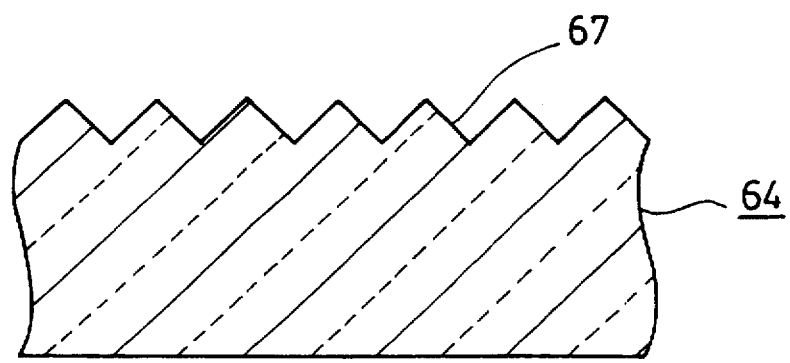
FIG. 12 is a typical sectional view of the surface of a screening layer included in the solar battery device of FIG. 11.

FIG. 11 is a typical sectional view showing a solar battery device of the ninth embodiment according to the present invention incorporated into a wristwatch, and components of the wristwatch disposed on the front side of the solar battery device, and FIG. 12 is a typical sectional view of the surface of a diffusing layer included in the solar battery device of FIG. 11.

A solar battery 63 is formed on the back surface of a substrate 62, such as a glass plate, by processing an amorphous silicon film deposited by a plasma CVD process. The front surface of the substrate 62 is processed to form a diffusing surface layer 67 of a shape as shown in FIG. 12 serving as a diffusing layer 64. The substrate 62 integrally provided with the diffusing layer 64 is fixedly held in a case 61. An optical member 65 and a white diffusing layer 66 are formed in that order on the front side of the diffusing layer 64. The front surface of the white diffusing layer 66 serves also as a dial. Thus a solar wristwatch is built.

The diffusing layer 64 has the diffusing surface layer 67 formed by machining one surface of the substrate 62 and having the shape of a continuous prism consisting of an array of 50 μm pyramids successively arranged in an X- and a Y-direction.

The optical member 65 is a high refractive index layer formed by depositing a titanium oxide film having a refractive index of 2.3 in a thickness of about 60 nm by an evaporation process on one surface of a PC (polycarbonate) plate.

The white diffusing layer 66 was formed by forming an ultraviolet-setting PMMA (methyl methacrylate) resin film by casting on the other surface, i.e., the surface on which the optical member 65 is not formed, of the PC plate and transferring the shape of a surface of a mother die processed by a honing process using 1000 mesh SiC powder and an etching process using a mixture of hydrofluoric acid and nitric acid to the PMMA resin film.

Sample diffusing layers having surface layers similar to the diffusing surface layer 67 of the thus built solar battery device and having pyramids of different apex angles in the range of 70° to 120° were subjected to experiments to measure their transmittances with respect to vertical incident light.

Figure 13:
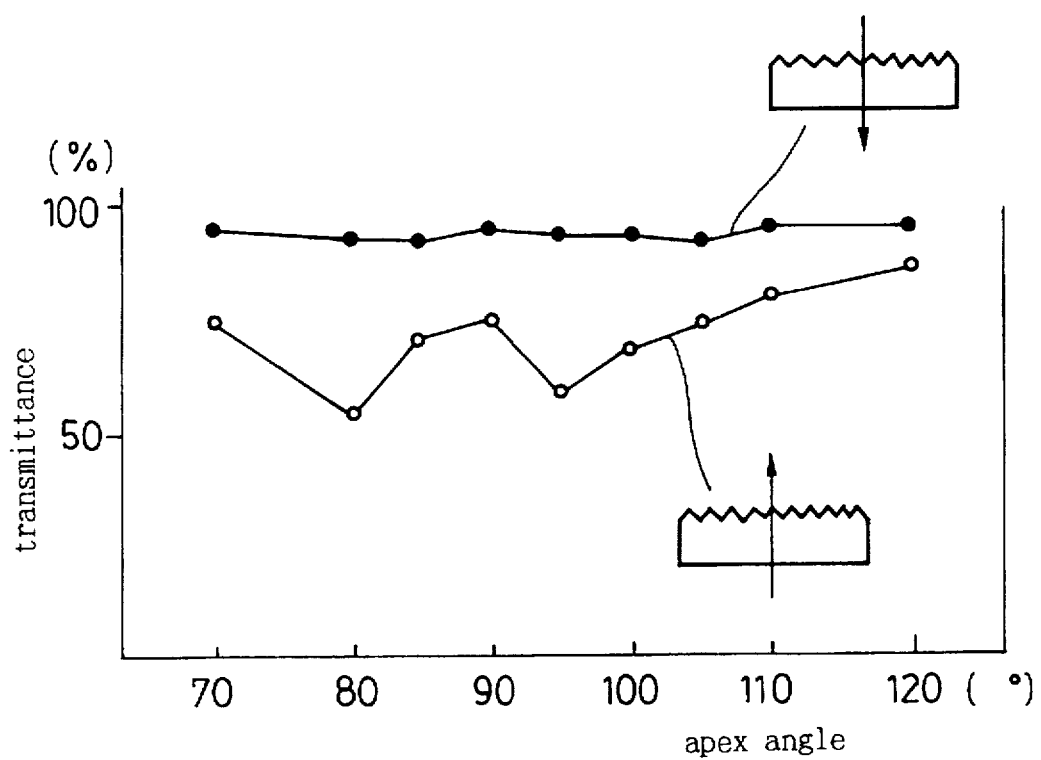
FIG. 13 is a graph showing the relation between the prism angle of the screening layer of FIG. 12 and transmittance.

In FIG. 13 showing measured results, data represented by solid circles indicates the apex angle dependence of transmittance for incident light from the side of the optical member 65 and data represented by blank circles indicates the apex angle dependence of transmittance for incident light from the side of the solar battery 63.

As is obvious from FIG. 13, the transmittance assumes a great anisotropy at several apex angles. For example, the transmittance for incident light from the side of the optical member 65 is 90% or above and the transmittance for incident light from the side of the solar battery 63 is 55% or below when the apex angle is 80°.

Thus, 90% or above of external light incident on the diffusing layer 64 is transmitted to the solar battery 63 for power generation, and 55% or below of reflected light from the solar battery 63 is able to travel through the diffusing layer 64 to the optical member 65.

The distribution of incident light under a room illumination environment, as compared with that of vertical incident light, shows a low directionality. However, even under such illuminating conditions, the diffusing layer 64 has an anisotropic light transmitting characteristic to transmit incident light from the side of the optical member 65 at a transmittance of 80% or above, and to transmit incident light from the side of the solar battery 63 at a transmittance of 60% or below.

In the ninth embodiment, the transmittance of the white diffusing layer 66 is about 92%, that of the optical member 65 is about 75% and that of the diffusing layer 64 to incident light from the side of the optical member 65 is about 90% or above. Therefore, at least about 65% of the external incident light is able to reach the solar battery 63 for power generation when there is some interfacial reflection.

The estimated reflectances of the amorphous silicon film and the metal electrodes of the solar battery 63 are about 20 and about 70%, respectively. Therefore, the quantity of light reflected by the metal electrodes that travels opposite to the external incident light is about 18% of the external incident light on the solar battery device, which is small as compared with the intensity of 21% of reflected light reflected by optical members and that exhibit a specific color. Accordingly, the light reflected by the solar battery 63 is scarcely perceivable from outside. The intensity of reflected light from other portions of the solar cells is still far lower.

When a diffusing layer in a Comparative Example having a transmittance of about 90% and not having anisotropic light transmitting characteristic was employed, the quantity of reflected light reflected by the metal electrodes of the solar battery 63 and traveling outward was about 30% and, consequently, the solar battery 63 could be distinctly perceived from the reflected light from the solar battery 63, which proved the diffusing effect of the diffusing layer to be insufficient.

The diffusing effect of the diffusing layer not having an anisotropic light transmitting characteristic may be enhanced by reducing its transmittance. When such a diffusing layer was employed, the quantity of light that reaches the solar battery 63 decreased and the intensity of the reflected light was not high enough to develop the appearance in a clear color, and the diffusing layer was unsatisfactory in both securing the quality of appearance and supplying radiant energy to the solar battery.

Tenth Embodiment

Figure 14:
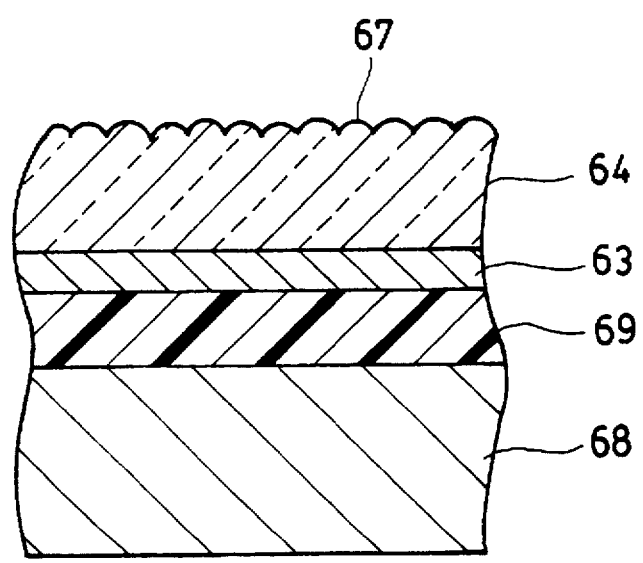
FIG. 14 is a typical sectional view of a solar battery device in which a screening layer is formed on a layer different from that on which the screening layer of the ninth embodiment is formed.

FIG. 14 is a typical sectional view of a solar battery device in which a diffusing layer is formed on a layer different from that on which the diffusing layer of the ninth embodiment is formed.

In the tenth embodiment, a solar battery 63 is formed on an insulating layer 69 formed on a metal substrate 68, and a diffusing layer 64 overlies the front surface of the solar battery 63. More concretely, the solar battery 63 is formed on the insulating layer 69 of a polyimide resin or the like formed on the metal substrate 68 of a stainless steel or the like, and the diffusing layer 64 having a diffusing surface layer 67 having semispherical protrusions is formed directly on the front surface of the solar battery 63.

The tenth embodiment is similar to the ninth embodiment in other respects. The tenth embodiment forms a mother die for forming the diffusing layer 64 by the following processes.

A gold film formed on a Si wafer of (100) was processed by a photolithographic process and an etching process to remove 5 μm diameter round portions of the gold film at a pitch of 30 μm.

Then, the Si wafer was immersed in a mixture of concentrated hydrofluoric acid, nitric acid, and acetic acid to remove portions of the Si wafer exposed by removing the round portions of the gold film by isotropic etching, and the gold film was removed. Thus a mother die having semispherical recesses regularly arranged in its surface was formed.

The diameter of the recesses is dependent on etching time. About 25 μm diameter semispherical recesses arranged successively and regularly in an X- and a Y-direction were formed on the surface of the mother die after the same had been etched for about thirty minutes.

An electroformed mold was formed by using the mother die, a PMMA resin film was cast on the solar battery 63, and then semispherical protrusions were formed in the PMMA resin film by transferring the shape of the electroformed mold to form the diffusing layer 64. Then, a PC plate having the functions of the optical member 65 and the white diffusing layer 66 (FIG. 11) of the ninth embodiment was attached to the front surface of the diffusing layer 64 to complete the solar battery device.

The solar battery device in the tenth embodiment was formed on a transparent glass plate and the anisotropic light transmitting characteristic of the diffusing layer 64 was examined. The diffusing layer 64 showed an anisotropic light transmitting characteristic represented by a transmittance of about 92% to incident light from the side of the optical member 65 and a transmittance of about 65% to incident light from the side of the solar battery 63.

Thus, in the solar battery device according to the tenth embodiment, reflected light from the solar battery 63 can be made perceivable simply by reducing the transmittance of the optical member 65.

Since the tenth embodiment employed the diffusing layer 64 of about 50 μm in thickness having the foregoing characteristic and formed on the solar battery 63, the solar battery device had a simple construction and had a relatively small thickness. The diffusing layer 64 covering the solar battery 63 serves also as a protective layer. Since only the single PC plate having major surfaces having the functions of the optical member 65 and the white diffusing layer 66 needs to be laid on the diffusing layer 64 overlying the solar battery 63, the solar battery device can be very easily assembled.

In the ninth and the tenth embodiments, the diffusing surface layer 37 may be formed in optional shape instead of the shape or an array of prisms or an array of semispheres. For example, the diffusing surface layer 67 may be formed in the shape of an array of lenses, an array of truncated prisms or an intermittent arrangement of prisms.

Although the semispherical recesses are arranged successively in the X- and the Y-direction on the diffusing surface layer 67 of the tenth embodiment, the semispherical recesses may be arranged in r-θ directions or may be shifted by half a pitch. It was proved that straight lines and the like on the solar battery 63 can be made more difficult to perceive from outside when the diffusing surface layer 67 is formed by transferring the shape of an electroformed mold having intentionally randomly arranged recesses.

The substrate on which the optical member and the white diffusing layer are formed need not necessarily be the PC plate, but may be a plate of any suitable one of various plastic materials. The substrate may be formed by any suitable process other than the injection molding process.

A white diffusing layer 66 can be formed by the method of forming the diffusing layer 64 employed in the tenth embodiment.

The high refractive index layer employed as an optical member in the ninth and the tenth embodiment may be substituted by an interference filter layer. The solar battery device looks like a specific color when an interference filter layer is employed instead of the high refractive index layer. However, since reflected light from the solar battery is scarcely perceivable from outside owing to the diffusing effect of the diffusing layer, an intended color is developed uniformly and precisely. Since the diffusing layer has a large transmittance, a clear color not having cloudy components is developed.

As is apparent from the foregoing description, since the diffusing layers employed in the ninth and the tenth embodiments satisfy requirements for both high transmittance and the diffusing effect, a solar battery device having an appearance of excellent quality and satisfying requirements for supplying energy to the solar battery and concealing the solar battery can be easily fabricated. Therefore the solar battery device is applicable to various purposes requiring colored appearances different from the conventional colored appearance.

Eleventh Embodiment

The spectral transmission characteristic and spectral reflection characteristic of an optical member for light emitted by a fluorescent lamp, which is generally used for room illumination, were examined when fabricating solar battery devices in eleventh and twelfth embodiments; that is, transmittance for reflected color and radiant energy emitted by a fluorescent lamp was evaluated and conditions for fabricating solar battery devices were examined. It was found that both the improvement of transmittance and the maintenance of quality of appearance can be achieved by forming a multilayer dielectric film consisting of at least two layers including at least one layer of an optical thickness (hereinafter referred to as "nd") expressed by $m \times \lambda/2$ ($\lambda$: one of bright line wavelengths, m: positive integer) on a substrate transparent to wavelengths in the visible region, such as a glass substrate or a plastic substrate.

Figure 15:
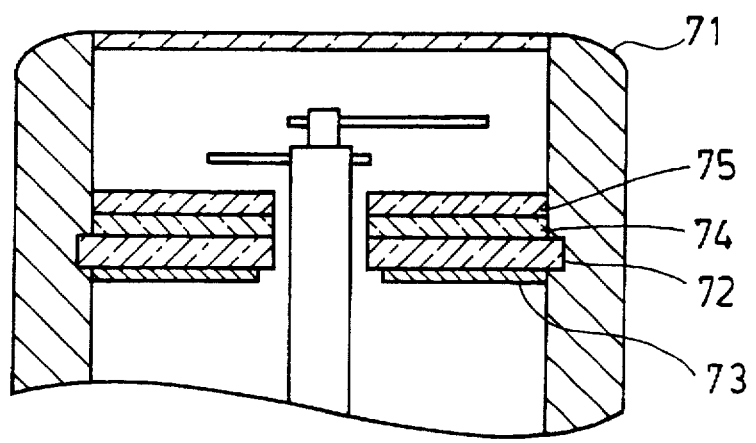
FIG. 15 is a typical sectional view showing a solar battery device in an eleventh embodiment according to the present invention incorporated into a wristwatch, and components of the wristwatch disposed on the front side of the solar battery device.

FIG. 15 is a typical sectional view showing a solar battery device in an eleventh embodiment according to the present invention incorporated into a wristwatch, and components of the wristwatch disposed on the front side of the solar battery device.

A transparent substrate 72 is fixedly held by the inner surface of a case 71. A solar battery 73 is formed on the back surface of the substrate 72 by processing an amorphous silicon film formed by a plasma CVD process.

An optical member 74 and a white diffusing layer 75 are formed in that order on the front surface of the substrate 72. The front surface of the white diffusing layer 75 serves as the dial of the solar wristwatch.

One surface of a glass substrate was mechanically roughened by a toning process using 1000 mesh SiC powder and then the roughened surface was etched with hydrofluoric acid for twenty seconds to form the white diffusing layer 75. The transmittance of the white diffusing layer 75 was about 91%.

Figure 16:
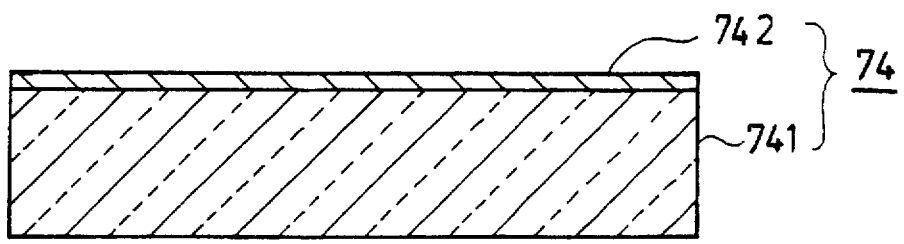
FIG. 16 is a typical sectional view of an optical member included in the solar battery device in the eleventh embodiment.

FIG. 16 is a typical sectional view of the optical member 74. The optical member 74 is a multilayer dielectric film 742 formed by depositing tantalum pentoxide ($Ta_2O_5$) having a refractive index of 2.1 and silicon dioxide ($SiO_2$) having a refractive index of 1.47 on a glass substrate 741 by a vacuum evaporation process. The design construction of the multilayer dielectric film 742 is expressed by:

Substrate/HLH·2 L·H/Air        (1)

H: $Ta_2O_5$ nd=(¾)$\lambda t$

L: $SiO_2$, nd=$\lambda t/4$ $\lambda t$=546 nm

Reflected light from the optical member 74 was yellowish green. Transmittance for radiant energy emitted by a cool white fluorescent lamp (FL-10W, Toshiba Corp.) used as a light source was measured.

Transmittance for radiant energy emitted by the fluorescent lamp was defined by the ratio of the intensity of a short-circuit current produced when the solar battery 73 is irradiated with light emitted by the light source through the optical member 74 and the transparent substrate 72 to the intensity of short-circuit current produced when the solar battery 73 was irradiated with light emitted by the light source through the transparent substrate 72. Transmittance for radiant energy emitted by the fluorescent lamp was about 70%.

When the solar battery 73 was irradiated with light emitted by the light source through the optical member 74, the white diffusing layer 75 and the transparent substrate 72, transmittance for radiant energy emitted by the fluorescent lamp was about 64%.

In the solar battery device thus fabricated, the solar battery 73 was concealed satisfactorily, the quality of appearance was satisfactory, and the optical member 74 transmitted radiant energy to the solar battery 73 more efficiently than the conventional optical member as shown in Table 3.

TABLE 3

|  | Transmittance for fluorescent light |
|---|---|
| Conventional optical member | 62% |
| Optical member of eleventh embodiment | 70% |

Figure 17:
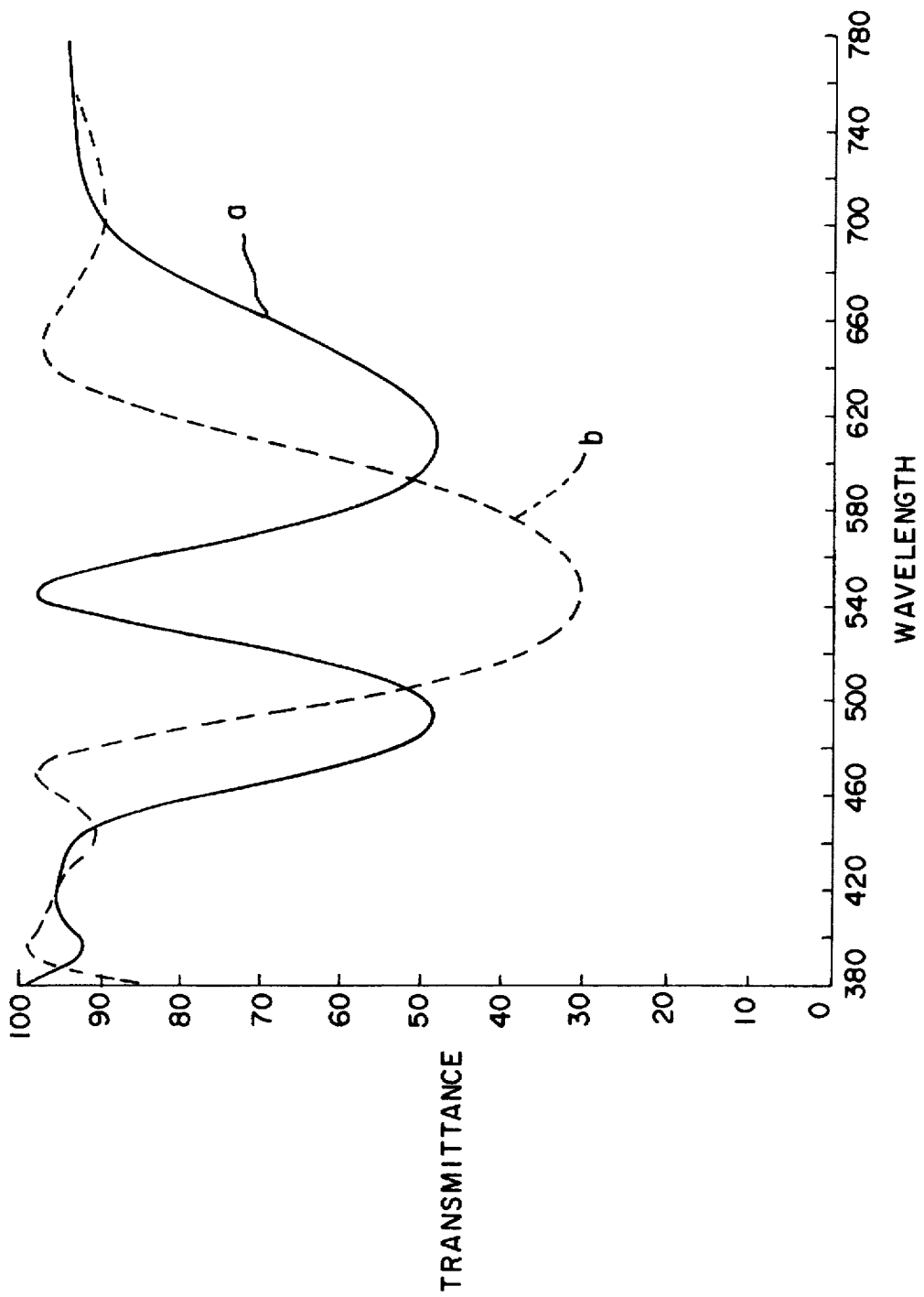
FIG. 17 is a graph showing the respective spectral transmittances of the optical member included in the eleventh embodiment and a conventional optical member.

FIG. 17 shows the spectral transmittance of the optical member 74 of the eleventh embodiment (curve a) and the spectral transmittance of the conventional optical member (curve b). Since the optical member 74 of the eleventh embodiment transmits high-intensity light of bright line wavelength to the solar battery 73, the transmittance of the optical member 74 is greater than that of the conventional optical member which does not transmit light of bright line wavelengths. The quality of appearance of the eleventh embodiment and that of the conventional solar battery device are on substantially the same level.

Figure 18:
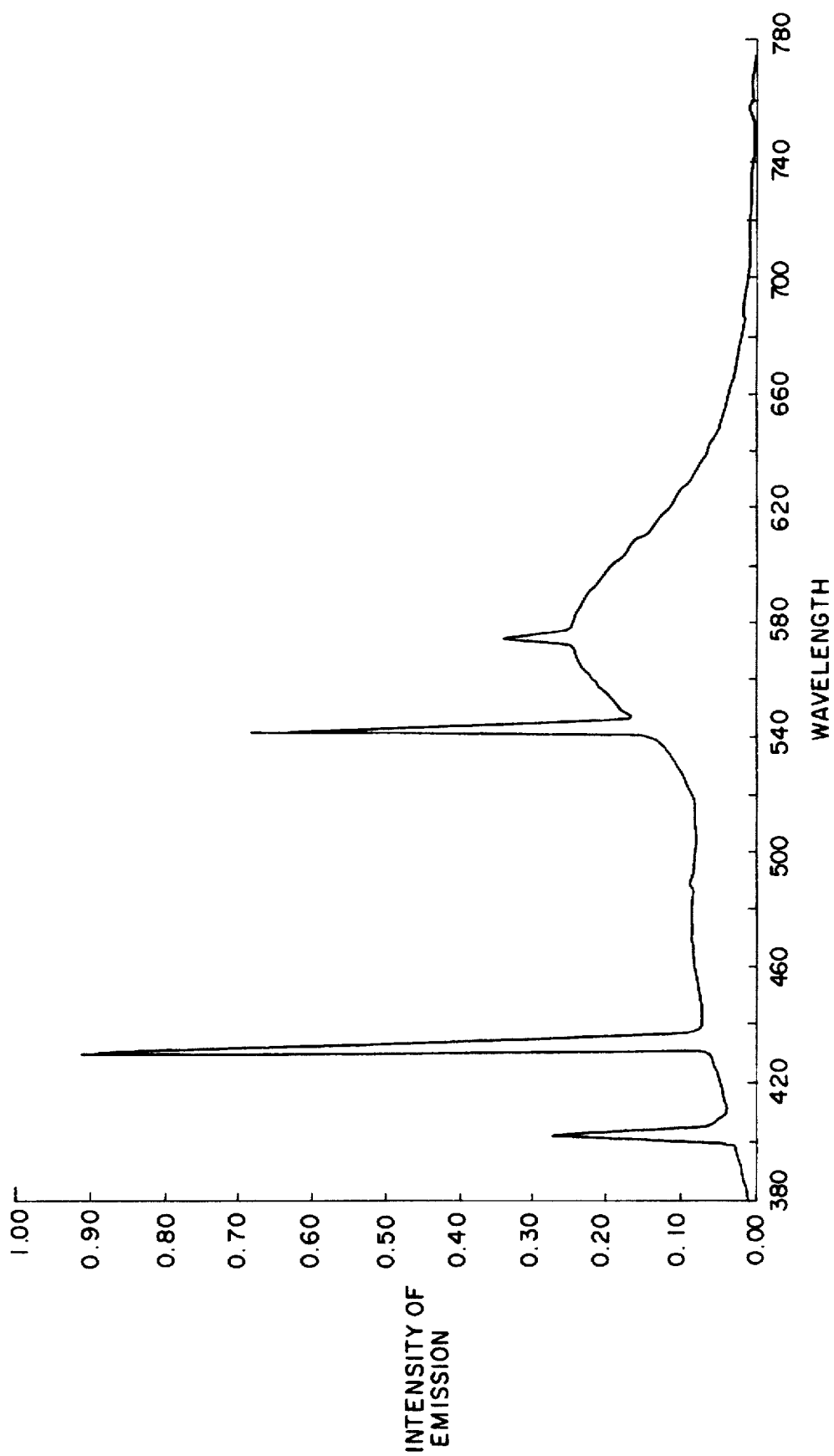
FIG. 18 is a graph showing the spectral radiation of a commercial fluorescent lamp.

The emission spectrum of a general use fluorescent lamp has three bright lines in the visible region. FIG. 18 shows the emission spectrum of a cool white fluorescent lamp (FL-10W, Toshiba Corp.). This emission spectrum has bright lines at $\lambda$=436 nm, 546 nm, and 578 nm.

As is obvious from FIG. 17, the optical member 74 of the eleventh embodiment transmits wavelengths $\lambda$ of 436 nm and 546 nm. The optical member 74 may be designed to transmit other wavelengths.

For example, when $\lambda t$ in Expression (1) is changed from 546 nm to 578 nm and an optical member of the same materials as those expressed by Expression (1) is used, the optical member transmits wavelengths $\lambda$ of 436 nm and 578 nm, and reflects yellowish orange light.

When a light source emits light of an emission spectrum having bright lines at wavelengths other than those shown in FIG. 18, an optical member can be formed by the same method so as to transmit wavelengths corresponding to the bright lines.

Twelfth Embodiment

Figure 19:
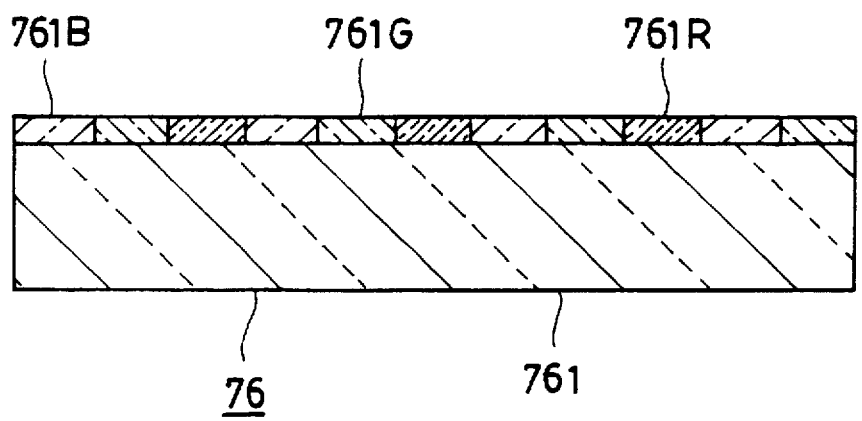
FIG. 19 is a typical sectional view of an optical member included in a solar battery device in a twelfth embodiment according to the present invention.

FIG. 19 is a typical sectional view of an optical member included in a solar battery device in a twelfth embodiment according to the present invention. The twelfth embodiment is similar to the eleventh embodiment, except that optical member 76 employed in the twelfth embodiment is different from that of the eleventh embodiment.

A 4 μm thick film of a positive photoresist (AZ-4620, Shipley Far East Ltd.) was formed on one major surface of a glass substrate 761 by a spin coating process. After drying the photoresist film, the photoresist film formed on the glass substrate 761 was exposed to light using a striped mask having parallel 50 μm wide linear openings arranged at a pitch of 150 μm, the exposed striped portions of the photoresist film were removed by developing so that portions of the surface of the glass substrate 761 corresponding to the exposed striped portions of the photoresist film were exposed, and a multilayer dielectric film of the following design construction was deposited on the exposed portions of the surface of the glass substrate 761 by evaporation.

Substrate/HLH·2 L·HLH/Air    (2)

H:Ta$_2$O$_5$ nd=(¾)$\lambda t$

L:SiO$_2$ nd=$\lambda t$/4

$\lambda t$=436 nm

Then, the residual photoresist film was removed by a lift-off process using acetone to obtain blue reflecting portions 761B. Then, the glass substrate 761 carrying the blue reflecting portions 761B was coated again with a photoresist film, and portions of the photoresist film adjacent to the blue reflecting portions 761B were exposed to light using the aforesaid mask. The exposed portions of the photoresist film were removed by developing so that the corresponding portions of the surface of the glass substrate 761 were exposed, and a multilayer dielectric film of the following design construction was deposited on the exposed portions of the surface of the glass substrate 761 by evaporation.

Substrate/HLH·2 L·H/Air    (3)

H:Ta$_2$O$_5$ nd=(¾)$\lambda t$

L:SiO$_2$ nd=$\lambda t$/4

$\lambda t$=546 nm

Then, the residual photoresist film was removed by a lift-off process to obtain yellowish green reflecting portions 761G.

Similarly, red reflecting portions 761R were formed by processing a multilayer dielectric film of the following design construction.

Substrate/HLHLHLH/Air    (4)

H:Ta$_2$O$_5$ nd=(¾)$\lambda t$

L:SiO$_2$ nd=$\lambda t$/4

$\lambda t$=680 nm

Thus, the optical member 76 was formed. The optical member 76 thus formed reflects white (achromatic) reflected light and assumes the appearance of a semitransparent filter. The transmittance of the optical member 76 for light emitted by a cool white fluorescent lamp was about 75%.

Figure 20:
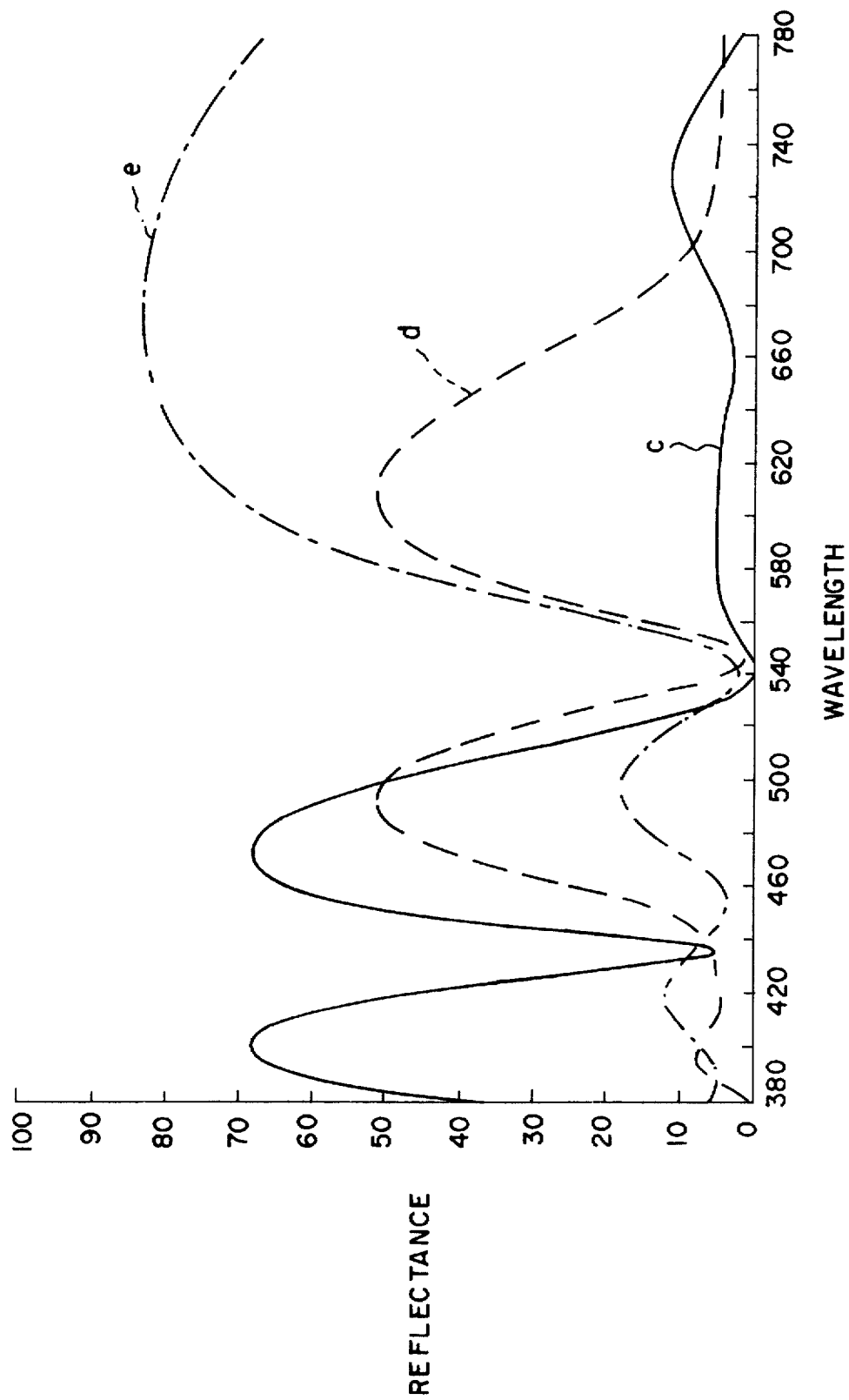
FIG. 20 is a graph showing the respective spectral reflectances of blue, yellowish green, and red reflecting members.

FIG. 20 shows the respective spectral reflection characteristics of the blue reflecting portions 761B, the yellowish green reflecting portions 761G, and red reflecting portions 761R of the optical member 76. In FIG. 20, curves c, d, and e represent the spectral reflection characteristics of the blue reflecting portions 761B, the yellowish green reflecting portions 761G, and the red reflecting portions 761R, respectively.

The color of reflected light from the optical member 76 and the transmittance of the optical member 76 are approximately equal to those estimated from the spectral reflection characteristics of the blue reflecting portions 761B, the yellowish green reflecting portions 761G, and the red reflecting portions 761R shown in FIG. 20.

The solar battery device thus fabricated, similarly to the solar battery device in the eleventh embodiment, was satisfactory in performance to conceal the solar battery 73 and in the quality of appearance. It was proved that the optical member of the twelfth embodiment has a large transmittance for radiant energy emitted by a fluorescent lamp as shown in Table 4 and has an excellent capability to supply energy to the solar battery 73.

Since the optical member 76 of the twelfth embodiment transmits light of wavelengths corresponding to high-intensity bright lines to the solar battery 73, the total transmittance of the optical member 76 of the twelfth embodiment is larger than that of the conventional optical member which does not transmit light of wavelengths corresponding to the bright lines and hence the optical member 76 of the twelfth embodiment is able to feed energy more efficiently to the solar battery 73 than the conventional optical member.

TABLE 4

|  | Transmittance for fluorescent light |
|---|---|
| Conventional optical member | 62% |
| Optical member of twelfth embodiment | 72% |

As is apparent from the foregoing description, since the optical members of the eleventh and twelfth embodiments have large transmittances for light emitted by fluorescent lamps, a solar battery device having an appearance of an excellent quality and meeting requirements for supplying energy to the solar cells of the solar battery and concealing the solar cells of the solar battery can be easily fabricated. The solar battery device is applicable to various purposes requiring colorful appearances and high power generating efficiency.

Although the blue reflecting portions 761B, the yellowish green reflecting portions 761G, and the red reflecting portions 761R are arranged in turn in the twelfth embodiment, those portions may be formed in any suitable pattern, such as a checkered pattern or a honeycomb pattern, provided that light rays reflected by those reflecting portions merge together so that they may not be individually perceptible. Although the width of the stripelike reflecting portions in the twelfth embodiment is 50 μm, the width need not be limited to 50 μm, provided that the reflecting portions are fine enough to make light rays reflected by the reflecting portions individually imperceptible. No problem arises in the quality of appearance when the width is about 100 μm or above.

Although the optical member 76 of the twelfth embodiment reflects white (achromatic) light, it is obvious from the theories of spectroscopy that the optical member 76 is able to reflect chromatic light other than white light by changing the ratios in intensity between the light rays reflected by those reflecting portions.

Although the optical member 76 of the twelfth embodiment has three different types of reflecting portions, i.e., the blue reflecting portions 761B, the yellowish green reflecting portions 761G, and the red reflecting portions 761R, the optical member 76 may be provided with two, four or any number of different types of reflecting portions. Even if the optical member 76 is provided with two or four different types of reflecting portions, there is no change in the ability of the optical member 76 to assume a color produced by the combination of colors of light rays reflected by the reflecting portions.

Although each of the optical members of the eleventh and twelfth embodiments is a multilayer dielectric film having one layer having nd=(bright line wavelength)/2 to transmit light of wavelengths corresponding to bright lines, the optical member may be provided with a plurality of such layers. Light of wavelengths corresponding to bright lines can be transmitted also when nd=m×(bright line wavelength)/2 (m is a positive integer). Dielectric materials other than tantalum pentoxide ($Ta_2O_5$) and silicon dioxide ($SiO_2$) may be used, provided that the dielectric materials are transparent.

Possible dielectric materials other than those used in the eleventh and the twelfth embodiment are, for example, zinc sulfide (ZnS), titanium oxide ($TiO_2$), zirconium oxide ($ZrO_2$), indium oxide ($In_2O_3$), yttrium oxide ($Y_2O_3$), magnesium oxide (MgO), aluminum oxide ($Al_2O_3$), lanthanum fluoride ($LaF_3$), magnesium fluoride ($MgF_2$), and lithium fluoride (LiF).

An optional color of reflected light can be determined while transmitting light of wavelengths corresponding to bright lines by adjusting the respective refractive indices of the layers dependent on the combination of those dielectric materials and the optical thicknesses of the layers.

Although each of the optical members of the eleventh and twelfth embodiments reflects monochromatic light, a pattern can be formed on the optical member when the optical member is provided with different types of reflecting portions having a size large enough to make the light rays reflected by the different types of reflecting portions individually perceptible.

Although the substrate of each of the optical members of the eleventh and twelfth embodiments is a glass substrate, an optical member having the same characteristics as those of the optical members employed in the eleventh and twelfth embodiments can be formed by using a transparent substrate of a material other than glass, such as a polycarbonate resin. When a multilayer dielectric film of the aforesaid design construction is formed on a transparent resin substrate, the H layer is liable to peel off the substrate or to crack. The peeling and cracking of the H layer can be prevented without changing the spectral reflection characteristic by interlaying an L layer between the substrate and the H layer.

The present invention is not limited in its application to the foregoing embodiments specifically described herein and various modifications of the foregoing embodiments are possible. For example, the solar battery and the components of the present invention may be formed on one major surface of a transparent substrate and the other major surface of the substrate may be used for another purpose, such as a dial.

Since the optical member, the diffusing layer, and the diffusing layer serving as the components of the solar battery device in accordance with the present invention can be formed in thin layers, a space of a thickness of only several hundreds micrometers is large enough to receive those components and there are few restrictions on the practical application of the solar battery device to apparatuses that use solar batteries.

Since the solar battery of the solar battery device in accordance with the present invention can be concealed, the solar battery can be disposed in a space which could not have been previously used for disposing the solar battery due to restrictions on design.

Although there have been many restrictions on the design of the solar battery to meet requirements for both function and appearance, first consideration can be given to function in designing the solar battery of the solar battery device of the present invention and a solar battery of a large capacity can be relatively freely used because the present invention conceals the solar battery from view.

According to the present invention, the solar battery is able to function properly and be concealed from view, the appearances can be expressed in diversified bright colors of excellent quality, the degree of freedom of design is increased, and the solar battery device is applicable to diversified purposes to which the conventional solar battery devices could not have been applied.

As mentioned in the description of the preferred embodiments of the present invention, the solar battery device of the present invention is applicable to not only solar wristwatches but also various apparatuses using solar batteries, such as electric desk calculators and radios.

INDUSTRIAL APPLICABILITY

The present invention is applicable to various products using solar batteries, such as watches, electric desk calculators, and radios.

The present invention ensures the supply of sufficient radiant energy to the solar battery, conceals the solar battery from view, and improves the quality of appearance.

We claim:

1. A solar battery device comprising:
   a screening layer disposed on the front side of a solar battery to diffuse light reflected from the solar battery to reduce the quantity of said light traveling outward from the front side of the solar battery;
   an optical member disposed on the front side of the screening layer to transmit wavelengths of said light in a predetermined wavelength range included in light incident the front side thereof at a predetermined transmittance;
   and a diffusing layer disposed on the front side of the optical member to diffuse and transmit light reflected from the optical member.

2. A solar battery device according to claim 1, wherein the screening layer has a transmittance in the range of 45 to 85%.

3. A solar battery device according to claim 1, wherein the screening layer has an anisotropic light transmitting characteristic showing different transmittances in different directions, and the quantity of light transmitted from the front side thereof to the solar battery is greater than that of light transmitted from the side of the solar battery to the front side.

4. A solar battery device according to claim 3, wherein the screening layer has a front side transmittance in the range of 60 to 96%.

5. A solar battery device according to claim 1, wherein the screening layer is formed by processing the front surface of a colorless, transparent plate into a three-dimensional shape.

6. A solar battery device according to claim 1, wherein the optical member comprises a transparent substrate, and a multilayer dielectric film thereon which is capable of transmitting at least one wavelength among the wave-lengths corresponding to bright lines of light in a visible region emitted by a light source.

7. A solar battery device according to claim 1, wherein the optical member is made of a high refractive index material having a refractive index of 1.6 or above.

8. A solar battery device according to claim 1, wherein the diffusing layer is formed of a material comprising a colorless, transparent plastic material, and a white powder capable of scattering light reflected from said optical member or transparent particles having a refractive index different from that of the colorless, transparent plastic material dispersed in the colorless, transparent plastic material.

9. A solar battery device according to claim 1, wherein the diffusing layer is a colorless, transparent body having a surface finished by roughening.

10. A solar battery device according to claim 8 or 9, wherein the diffusing layer has a transmittance of 80% or above.

11. A solar battery device comprising:
    an optical member disposed on the front side of a solar battery to transmit wavelengths of light in an optical wavelength range included in light incident the front side thereof at a predetermined transmittance;
    and a diffusing layer disposed on the front side of the optical member to transmit light reflected from the optical member after diffusion, wherein the optical member is made of a high refractive index material having a refractive index of 1.6 or above.

12. A solar battery device according to claim 11, wherein the diffusing layer is formed of a material comprising a colorless, transparent plastic material, and a white powder capable of scattering said reflected light or transparent particles having a refractive index different from that of the colorless, transparent plastic material dispersed in the colorless, transparent plastic material.

13. A solar battery device according to claim 11, wherein the diffusing layer is a colorless, transparent body having a surface finished by roughening.

14. A method of fabricating a solar battery device comprising a screening layer disposed on the front side of a solar battery to diffuse light reflected from the solar battery thereby to reduce the quantity of said light traveling outward from the front side of the solar battery, an optical member disposed on the front side of the screening layer to transmit wavelengths of said light in a predetermined wavelength range included in light incident the front side thereof at a predetermined transmittance, and a diffusing layer disposed on the front side of the optical member to transmit light reflected from the optical member after diffusion, wherein the diffusing layer is formed by mechanically roughening one surface of a colorless, transparent plate in an irregularly rough shape, and then processing the surface by a chemical etching process.

15. A method of fabricating a solar battery device comprising a screening layer disposed on the front side of a solar battery to diffuse light reflected from the solar battery thereby reduce the quantity of said light traveling outward from the front side of the solar battery, an optical member disposed on the front side of the screening layer to transmit wavelengths of said light in a predetermined wavelength range included in light incident the front side thereof at a predetermined transmittance, and a diffusing layer disposed on the front side of the optical member to transmit light reflected from the optical member after diffusion, wherein the diffusing layer is formed by a method comprising the steps of: forming a mother die having a surface provided with an arrangement of protrusions and recesses, and casting a transparent resin on the mother die or on an electroformed mold formed by using the mother die, to obtain a transparent resin film having protrusions and recesses in its surface.

16. A method of fabricating a solar battery device comprising a screening layer disposed on the front side of a solar battery to diffuse light reflected from the solar battery thereby to reduce the quantity of said light traveling outward from the front side of the solar battery, an optical member disposed on the front side of the screening layer to transmit wavelengths of said light in a predetermined wavelength range included in light incidents the front side thereof at a predetermined transmittance, and a diffusing layer disposed on the front side of the optical member to transmit light reflected from the optical member after diffusion, wherein the screening layer is formed by mechanically roughening one surface of a colorless, transparent plate.

17. A method of fabricating a solar battery device comprising a screening layer disposed on the front side of a solar battery to diffuse light reflected from the solar battery thereby to reduce the quantity of said light traveling outward from the front side of the solar battery, an optical member disposed on the front side of the screening layer to transmit wavelengths of said light in a predetermined wavelength range included in light incident the front side thereof at a predetermined transmittance, and a diffusing layer disposed on thee front side of the optical member to transmit reflected light reflected from the optical member after diffusion, wherein the screening layer is formed by a method comprising the steps of: forming a mother die having a surface provided with an arrangement of protrusions and recesses, and casting a transparent resin on the mother die or on an electroformed mold formed by using the mother die, to obtain a transparent resin film having protrusions and recesses in its surface.

18. A method of fabricating a solar battery device comprising an optical member disposed on the front side of a solar battery to transmit wavelengths of light in a visible region included in light incident the front surface thereof at a predetermined transmittance without dependence on a specific wavelength, and a diffusing layer disposed on the front side of the optical member to transmit light reflected from the optical member after diffusion, wherein the diffusing layer is formed by mechanically roughening one surface of a colorless, transparent plate in an irregularly rough shape, and then processing the surface by a chemical etching process.

19. A method of fabricating a solar battery device comprising an optical member disposed on the front side of a solar battery to transmit wavelengths of light in a predetermined wavelength range included in light incident the front surface thereof at a predetermined transmittance, and a diffusing layer disposed on the front side of the optical member to transmit light reflected from the optical member after diffusion, wherein the diffusing layer is formed by a method comprising the steps of: forming a mother die having a surface provided with an arrangement of protrusions and recesses, and casting a transparent resin on the mother die or on an electroformed mold formed by using the mother die, to obtain a transparent resin film having protrusions and recesses in its surface.

* * * * *